United States Patent
Kawasumi

(10) Patent No.: US 7,675,804 B2
(45) Date of Patent: Mar. 9, 2010

(54) SEMICONDUCTOR INTEGRATED CIRCUIT DEVICE AND SEMICONDUCTOR DEVICE INCLUDING PLURALITY OF SEMICONDUCTOR CIRCUITS

(75) Inventor: Atsushi Kawasumi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 215 days.

(21) Appl. No.: 11/975,470

(22) Filed: Oct. 19, 2007

(65) Prior Publication Data

US 2008/0094125 A1  Apr. 24, 2008

(30) Foreign Application Priority Data

Oct. 20, 2006 (JP) .............................. 2006-286916

(51) Int. Cl.
*G11C 5/14* (2006.01)
(52) U.S. Cl. ..................... 365/226; 365/51; 365/205; 365/154
(58) Field of Classification Search .............. 365/226, 365/205, 233.1, 51, 154
See application file for complete search history.

(56) References Cited

U.S. PATENT DOCUMENTS 6,426,908 B1 * 7/2002 Hidaka .................. 365/222
6,809,606 B2 10/2004 Wong et al.
6,967,522 B2 11/2005 Chandrakasan et al.

FOREIGN PATENT DOCUMENTS

JP  2004-363374  12/2004
JP  2006-120686  5/2006

* cited by examiner

*Primary Examiner*—Huan Hoang
(74) *Attorney, Agent, or Firm*—Sprinkle IP Law Group

(57) ABSTRACT

A semiconductor integrated circuit device includes a first semiconductor circuit, a second semiconductor circuit, a first control circuit and a second control circuit. The first and second semiconductor circuits are formed on a semiconductor substrate and operate using a voltage provided by an external power supply circuit as a power supply voltage. The first control circuit is formed on the semiconductor substrate and holds control information used to control the voltage generated by the external power supply circuit in accordance with operating performance of the first and second semiconductor circuits. The second control circuit controls a property of the first semiconductor circuit in accordance with the control information held by the first control circuit.

20 Claims, 15 Drawing Sheets

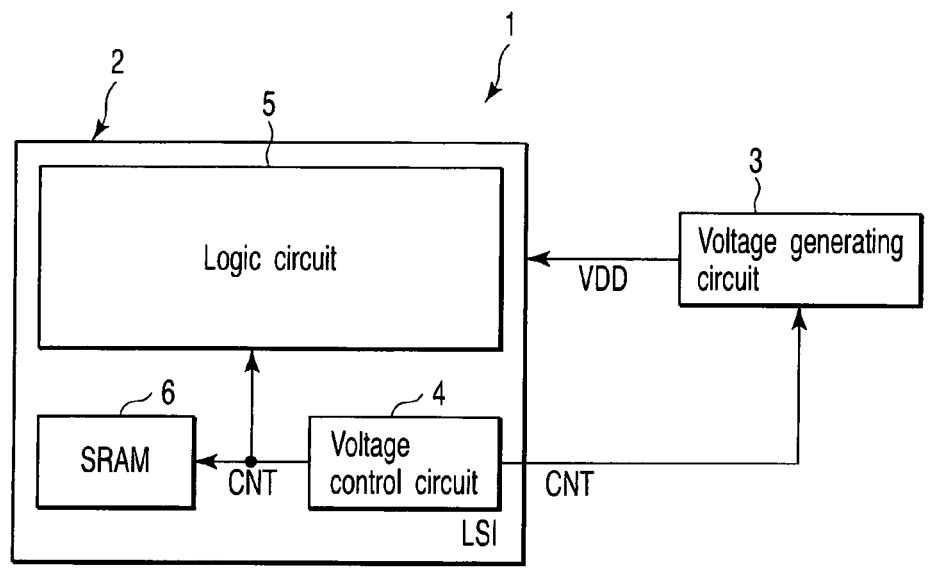
FIG. 1
| Control information | VDD |
|---|---|
| "01" | 0.9V |
| "10" | 1.0V |
| "11" | 1.1V |
FIG. 2
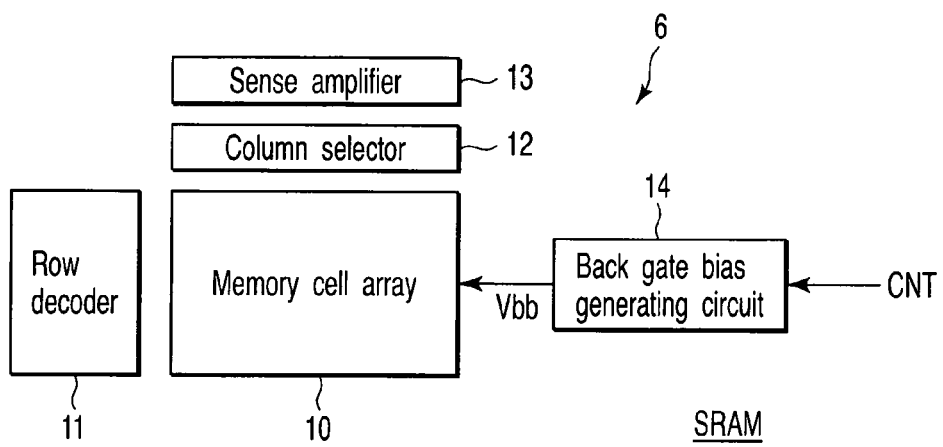
FIG. 3

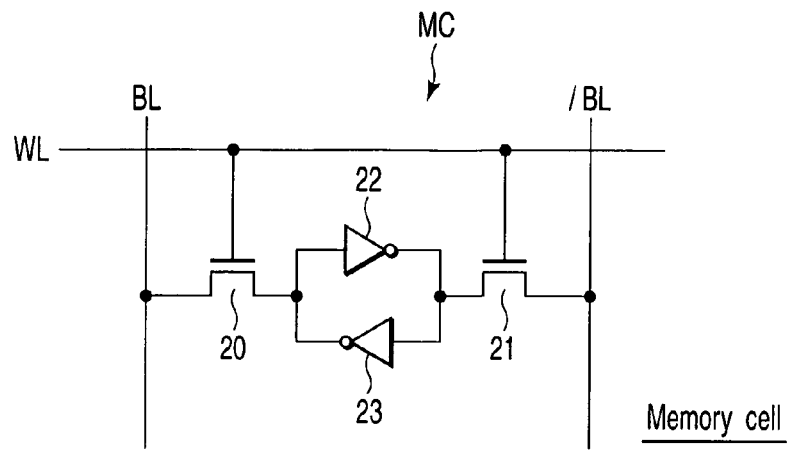
FIG. 4
| Control information | Vbb |
|---|---|
| "01" | 0.2V |
| "10" | 0.1V |
| "11" | 0V |
FIG. 5
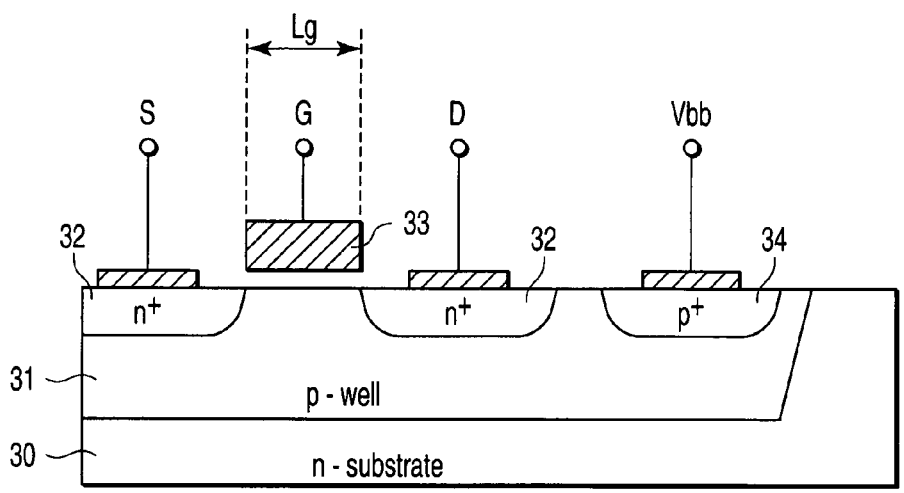
FIG. 6

CASE1

CASE2

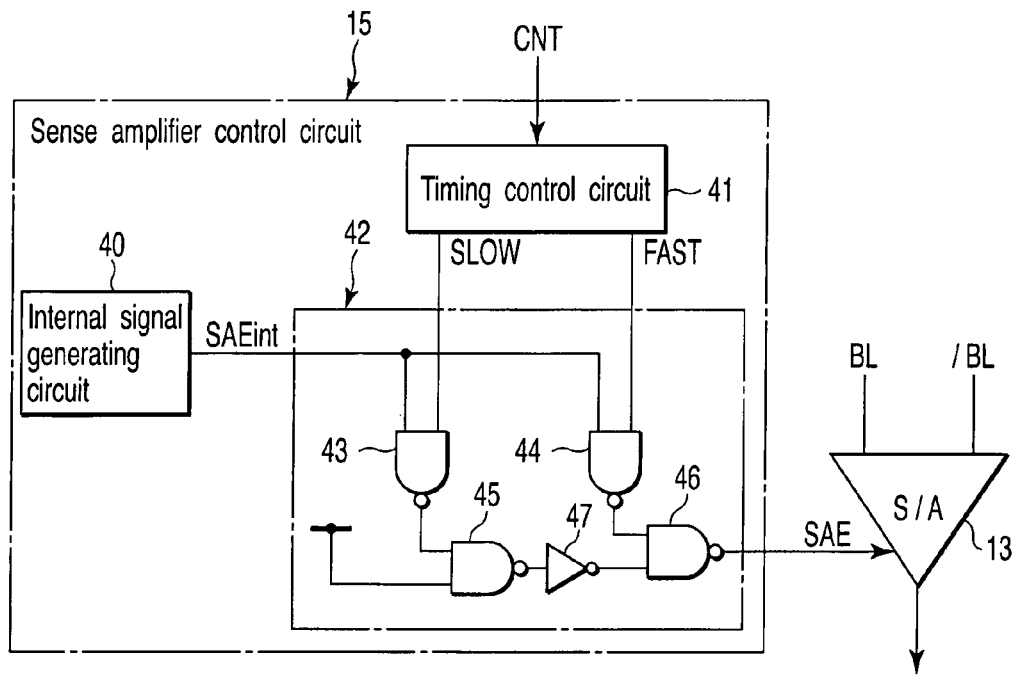
FIG. 13
| Control information | SLOW | FAST |
|---|---|---|
| "01" | "1" | "0" |
| "10" | "0" | "1" |
FIG. 14
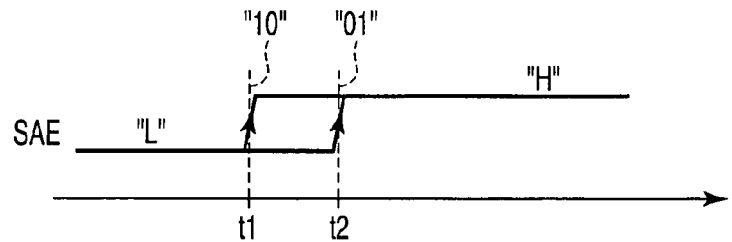
FIG. 15

| Control information | P0 | N0 | P1 | N1 |
|---|---|---|---|---|
| "01" | "1" | "0" | "1" | "0" |
| "10" | "0" | "1" | "1" | "0" |
F I G. 2 0
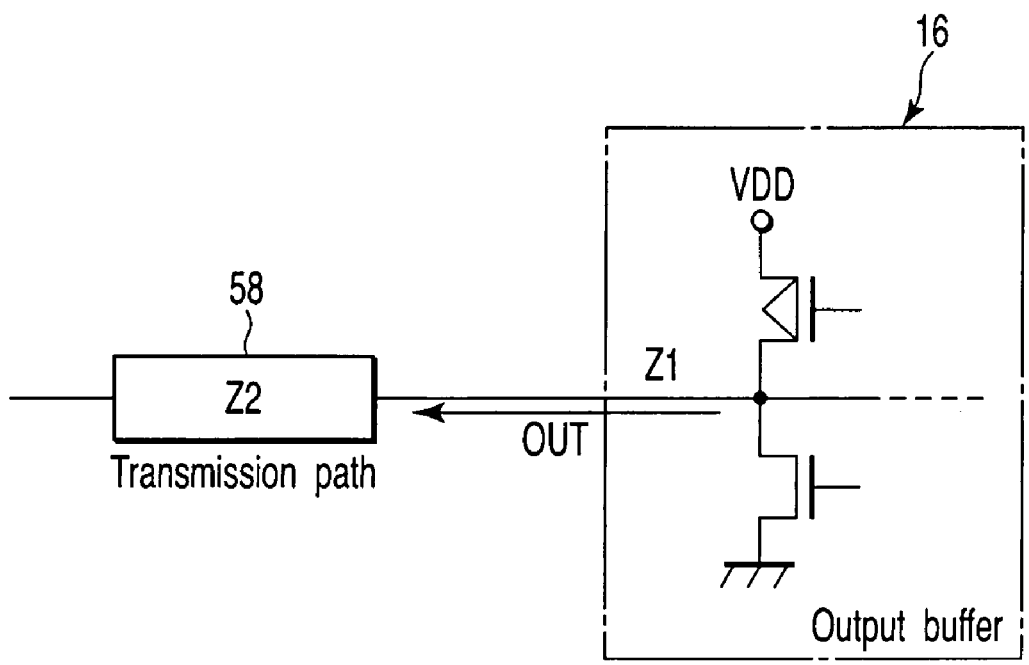
F I G. 2 1

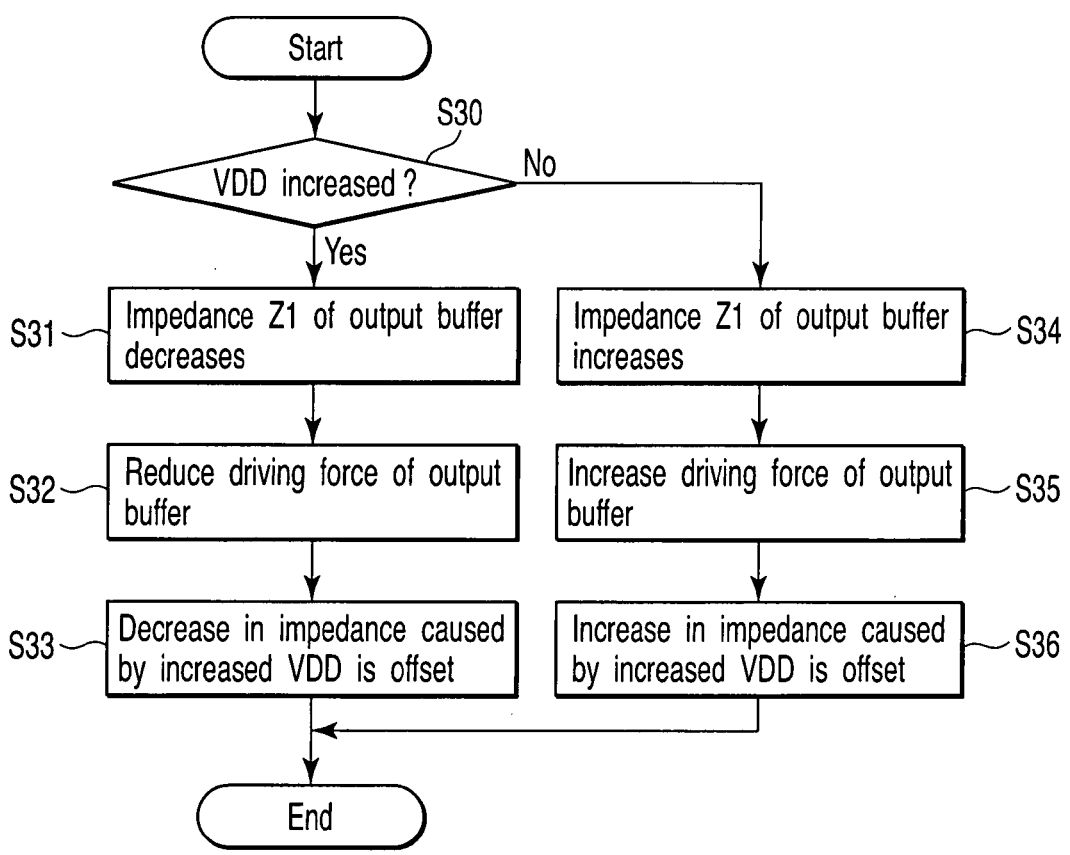
F I G. 2 2

| Control information | Vbb |
|---|---|
| "01" | 0.1V |
| "10" | 0.2V |
| "11" | 0.0V |

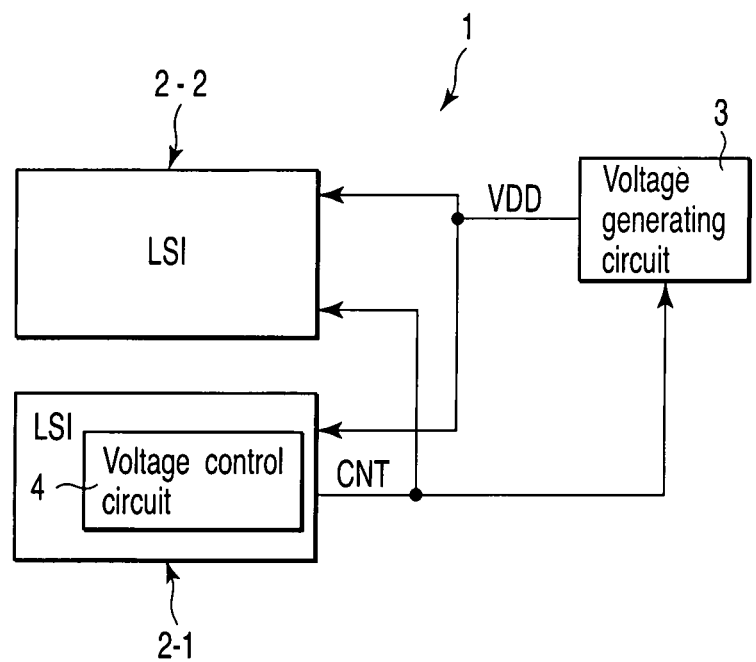
F I G. 3 0
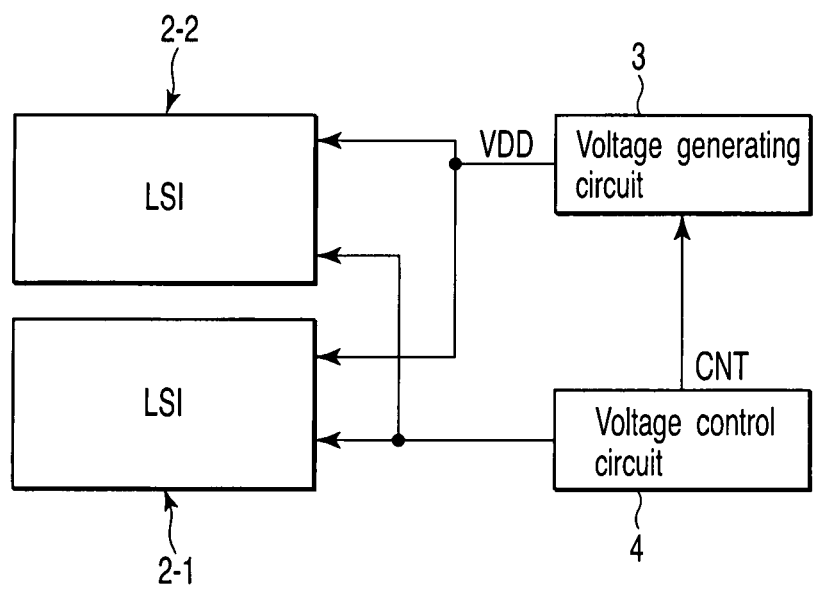
F I G. 3 1

SEMICONDUCTOR INTEGRATED CIRCUIT DEVICE AND SEMICONDUCTOR DEVICE INCLUDING PLURALITY OF SEMICONDUCTOR CIRCUITS

CROSS-REFERENCE TO RELATED APPLICATIONS

This application is based upon and claims the benefit of priority from prior Japanese Patent Application No. 2006-286916, filed Oct. 20, 2006, the entire contents of which are incorporated herein by reference.

BACKGROUND OF THE INVENTION

1. Field of the Invention

The present invention relates to a semiconductor integrated circuit device and a semiconductor device. For example, the present invention relates to a semiconductor integrated circuit device that controls a power supply voltage provided by an external power supply circuit.

2. Description of the Related Art

In recent years, semiconductor devices have been significantly miniaturized. The miniaturization has resulted in a frequent problem attributed to a manufacturing variation among semiconductor devices. That is, the manufacturing variation varies, for example, operating speed and power consumption during standby, among semiconductor chips.

Thus, a technique is known which varies the value of a power supply voltage depending on the properties of the whole semiconductor chip to set the operating speed and the power consumption at values suitable for the product. Such a technique is disclosed in, for example, Jpn. Pat. Appln. KOKAI Publication Nos. 2006-120686 and 2004-363374. Since the properties of the semiconductor device also vary depending on the power supply voltage, these techniques vary the power supply voltage to offset the variation in properties caused by the manufacturing variation.

However, the above techniques vary the value of the power supply voltage on the basis of the properties of the whole semiconductor chip. Thus, the variation in power supply voltage may not be suitable for all the individual semiconductor circuits contained in the semiconductor chip. The variation may even affect some of the semiconductor circuits.

BRIEF SUMMARY OF THE INVENTION

A semiconductor integrated circuit device according to an aspect of the present invention includes:

a first semiconductor circuit formed on a semiconductor substrate and operating using a voltage provided by an external power supply circuit as a power supply voltage;

a second semiconductor circuit formed on the semiconductor substrate and operating using the voltage provided by the external power supply circuit as a power supply voltage;

a first control circuit formed on the semiconductor substrate and holding control information used to control the voltage generated by the external power supply circuit in accordance with operating performance of the first and second semiconductor circuits; and a second control circuit which controls a property of the first semiconductor circuit in accordance with the control information held by the first control circuit.

A semiconductor device according to an aspect of the present invention includes:

a semiconductor integrated circuit device including a first semiconductor circuit and a second semiconductor circuit formed on the same semiconductor substrate, and operating using a voltage provided by an external semiconductor circuit as a power supply voltage; and a first control circuit which holds control information used to control the voltage generated by the external power supply circuit in accordance with operating performance of the semiconductor integrated circuit device, the semiconductor integrated circuit device further including a second control circuit which controls a property of the first semiconductor circuit in accordance with the control information.

BRIEF DESCRIPTION OF THE SEVERAL VIEWS OF THE DRAWING

FIG. 1 is a block diagram of an LSI in accordance with a first embodiment of the present invention;

FIG. 2 is a table showing the relationship between control information held by a voltage control circuit provided in an LSI in accordance with the first embodiment of the present invention and a power supply voltage generated by a voltage generating circuit;

FIG. 3 is a block diagram of SRAM provided in an LSI in accordance with the first embodiment of the present invention;

FIG. 4 is a circuit diagram of a memory cell provided in SRAM in accordance with the first embodiment of the present invention;

FIG. 5 is a table held by a back gate bias generating circuit provided in SRAM in accordance with the first embodiment of the present invention;

FIG. 6 is a sectional view of a MOS transistor contained in the memory cell provided in SRAM in accordance with the first embodiment of the present invention;

FIG. 13 is a circuit diagram of a sense amplifier control circuit provided in an LSI in accordance with the second embodiment of the present invention;

FIG. 14 is a table held by a timing control circuit provided in SRAM in accordance with the second embodiment of the present invention;

FIG. 15 is a timing chart of a sense amplifier activation signal output by the sense amplifier control circuit provided in SRAM in accordance with the second embodiment of the present invention;

FIG. 20 is a table held by the output buffer control circuit provided in SRAM in accordance with the third embodiment of the present invention;

FIG. 21 is a circuit diagram of an output buffer and a load connected to the output buffer;

FIG. 22 is a flowchart showing operations of a voltage control circuit and an output buffer control circuit in SRAM in accordance with the third embodiment of the present invention;

FIG. 30 is a block diagram of a semiconductor device in accordance with a first variation of the first to fifth embodiments of the present invention; and FIG. 31 is a block diagram of a semiconductor device in accordance with a second variation of the first to fifth embodiments of the present invention.

DETAILED DESCRIPTION OF THE INVENTION

First Embodiment

Figure 7:
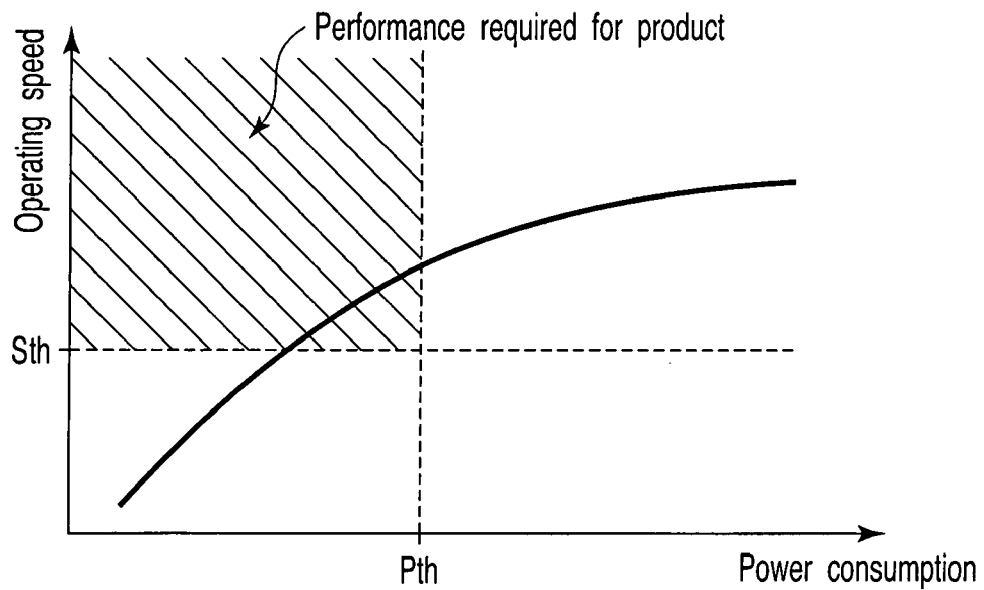
FIG. 7 is a graph showing the relationship between the power consumption and operating speed of an LSI.

With reference to FIG. 1, description will be given of a semiconductor integrated circuit device in accordance with a first embodiment of the present invention. FIG. 1 is a block diagram of a semiconductor device system in accordance with the present embodiment.

As shown in the figure, a system 1 includes a semiconductor integrated circuit (LSI) 2 and a voltage generating circuit 3. The voltage generating circuit 3 generates and supplies a voltage VDD to the LSI 2. The LSI 2 operates using voltage VDD provided by the voltage generating circuit 3 as a power supply voltage VDD.

The LSI 2 includes a voltage control circuit 4, a logic circuit 5, and static random access memory (SRAM) 6 which are formed on the same semiconductor substrate. The voltage control circuit 4 holds control information CNT. The control information CNT is used to control the voltage generating circuit 3. FIG. 2 shows the relationship between the control information CNT and voltage VDD, generated by the voltage generating circuit 3.

As shown in the figure, the control information CNT is, for example, binary data of two digits, and three types of binary data, 01, 10, and 11 are provided. The voltage control circuit 4 holds one of these data. For CNT=01, the voltage control circuit 4 generates VDD=0.9V. For CNT=10, the voltage control circuit 4 generates VDD=1.0V. For CNT=11, the voltage control circuit 4 generates VDD=1.1V. The control information CNT is also provided to the logic circuit 5 and SRAM 6, which respectively utilize the information. Te voltage control circuit 4 has a nonvolatile storage element, for example, a fuse element, to which the control information CNT is written during manufacture.

Now, SRAM 6 will be described. FIG. 3 is a block diagram showing the configuration of SRAM 6. As shown in the figure, SRAM 6 includes a memory cell array 10, a row decoder 11, a column selector 12, a sense amplifier 13, and a back gate bias generating circuit 14. The memory cell array 10 has a plurality of memory cells MC arranged in a matrix. The configuration of the memory cells MC will be described with reference to FIG. 4. FIG. 4 is a circuit diagram of the memory cell MC.

As shown in the figure, the memory cell MC includes two n-channel MOS transistors 20 and 21 and two inverters 22 and 23. An input node of the inverter 22 is connected to an output node of the inverter 23. An output node of the inverter 22 is connected to an input node of the inverter 23. One end of a current path of the MOS transistor 20 is connected to the input node of the inverter 22 and to the output node of the inverter 23. The other end of the current path of the MOS transistor 20 is connected to a bit line BL. One end of a current path of the MOS transistor 21 is connected to the output node of the inverter 22 and to the input node of the inverter 23. The other end of the current path of the MOS transistor 21 is connected to a bit line /BL. Gates of the MOS transistors 20 and 21 are connected to the same word line WL.

The memory cells MC configured as described above are arranged in a matrix in the memory cell array 10. The memory cells MC in the same column are connected to the same bit line pair BL and /BL. The memory cells in the same row are connected to the same word line WL.

Now, referring back to FIG. 3, the configuration of SRAM 3 will be continuously described. The row decoder 11 selects any of the word lines WL for a read or write. The row decoder 11 then applies a voltage to the selected word line WL to turn on the MOS transistors 20 and 21 in the corresponding memory cell MC.

The column selector 12 selects any of the bit line pairs BL and /BL for a read. The column selector 12 connects the selected bit line pair BL and /BL to the sense amplifier 13.

The sense amplifier 13 senses and amplifies, for a read, data read to the bit line BL selected by the column selector 12, on the basis of the potential of the bit line /BL.

The back gate bias generating circuit 14 generates a back gate bias voltage Vbb. The back gate bias generating circuit 14 applies back gate bias voltage Vbb to a back gate of the MOS transistors contained in the memory cell MC. The back gate bias generating circuit 14 determines the magnitude of back gate bias voltage Vbb on the basis of the control information CNT provided by the voltage control circuit 4. FIG. 5 shows the relationship between the control information CNT and back gate bias voltage Vbb. FIG. 5 is an example of a table showing the relationship between the control information CNT and the magnitude of back gate bias voltage Vbb applied to the n-channel MOS transistor. The table is held by the back gate bias generating circuit 14.

As shown in the figure, for CNT=01, the back gate bias generating circuit 14 generates Vbb=0.2V. For CNT=10, the back gate bias generating circuit 14 generates Vbb=0.1V. For CNT=11, the back gate bias generating circuit 14 generates Vbb=0V. That is, the control information CNT reduces VDD, and the back gate bias generating circuit 14 generates the back gate bias voltage Vbb so as to increase a threshold voltage Vth of the MOS transistors. FIG. 6 is a sectional view of the n-channel MOS transistor.

As shown in the figure, a p-type well region 31 is formed in a surface area of an n-type semiconductor substrate 30. In the surface area of the p-type well area 31, $n^+$-type impurity diffusion layers 32 functioning as a source S and a drain D are formed separately from each other. A gate electrode 33 is formed on the p-type well area 31 between the source and the drain with a gate insulating film (not shown) interposed therebetween. A length along a source, a channel, and a drain of the gate electrode 33 is hereinafter referred to as a gate length Lg. A $p^+$-type impurity diffusion layer 34 is formed in a surface area of the p-type well area 31. Back gate bias voltage Vbb is applied to the p-type well area 31 via the diffusion layer 34.

With reference to FIGS. 5 and 6, the n-channel MOS transistor has been described by way of example. However, the above description also applies to a p-channel MOS transistor. That is, the back gate bias generating circuit 14 generates back gate bias voltage Vbb so as to increase the threshold voltage Vth also in the p-channel MOS transistor in accordance with reducing VDD.

The LSI 2 configured as described above produces the following effect.

(1) A variation in properties among semiconductor elements can be reduced to improve the operating stability of the LSI (item 1).

The LSI 2 in accordance with the present embodiment includes the voltage control circuit 4, which holds the control information CNT used to control a power supply voltage VDD generated by the voltage generating circuit 3 in accordance with the operating performance of the LSI 2. In accordance with the control information CNT, SRAM 3 in the LSI 2 controls the threshold voltage Vth of the memory cell MC. This enables the operating stability of the LSI 2 to be improved. The effect will be described below in detail.

A decrease in gate length Lg or threshold voltage Vth normally increases the operating speed and the power consumption during standby for the LSI 2. In contrast, an increase in gate length Lg or threshold voltage Vth reduces the operating speed and the power consumption during standby for the LSI 2.

That is, conditions for increasing the operating speed also increase the power consumption. In contrast, conditions for reducing the power consumption speed also reduce the operating speed. That is, there is a tradeoff relationship between the operating speed and the power consumption. The relationship between the power consumption during standby and the operating speed is shown in FIG. 7. FIG. 7 is a graph showing the relationship between the power consumption during standby and the operating speed.

As shown in the figure, the operating speed increases consistently with the power consumption. Of course, for the performance of the LSI 2, the power consumption is preferably low and the operating speed is preferably high. For the product, the power consumption during standby is desired to have a given value Pth and the operating speed is desired to have a given value Sth. That is, the product is desired to meet the performance corresponding to a shaded area in FIG. 7. However, it may be very difficult to meet such performance as shown in FIG. 7 owing to a variation in manufacturing process.

Figure 8:
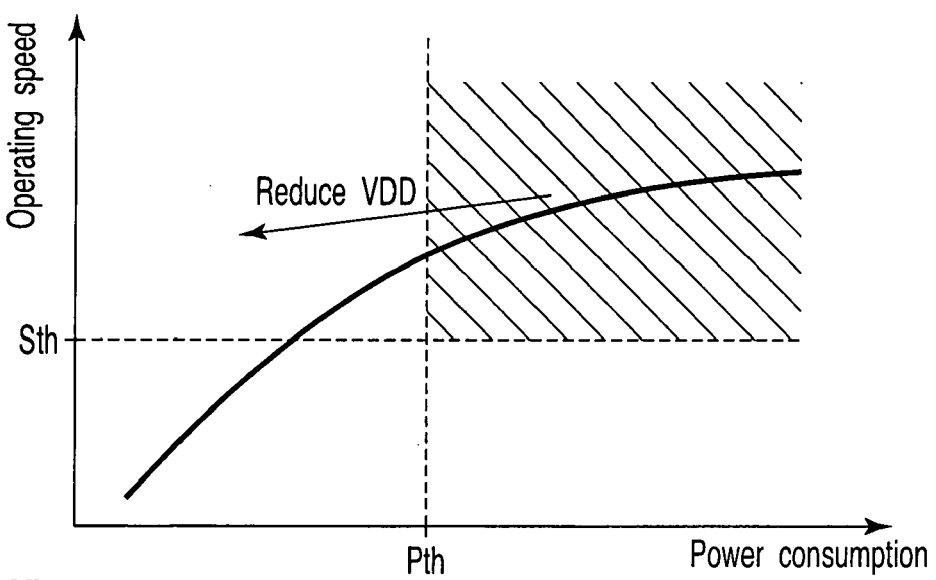
FIG. 8 is a graph showing the relationship between the power consumption and operating speed of an LSI in accordance with the first embodiment of the present invention and also showing that the power consumption is reduced by decreasing VDD.

Thus, in the present embodiment, the voltage control circuit 4 uses the control information CNT to control voltage VDD, generated by the voltage generating circuit 3. The control information CNT is known as, for example, Voltage ID. With reference to FIG. 8, description will be given of a case (CASE 1) in which, for example, in a manufacture stage, the conditions for the operating speed are met, whereas conditions for the power consumption are not met. FIG. 8 is a graph showing the relationship between the consumption during standby and the operating speed.

As shown in the figure, the performance of the LSI 2 is assumed to correspond to the inside of the shaded area in the figure. That is, the operating speed has at least the given value Sth but the power consumption exceeds the given value Pth. This corresponds to, for example, the reduced gate length Lg or reduced threshold voltage Vth. In this case, during the manufacture of the LSI 2, the power consumption and operating speed are checked and 01 is written to the voltage control circuit 4 as control information CNT. Then, the voltage generating circuit 3 sets a lower power supply voltage VDD in accordance with the table shown in FIG. 2. The reduced power supply voltage VDD of course reduces the power consumption of the LSI 2. This makes it possible to set the power consumption equal to or smaller than the given value Pth while maintaining the operating speed at the given value Sth as shown by an arrow in FIG. 8. That is, it is difficult to meet the conditions for both of the operating speed and the power consumption. The power supply voltage VDD, therefore is subsequently used to meet the conditions.

Figure 9:
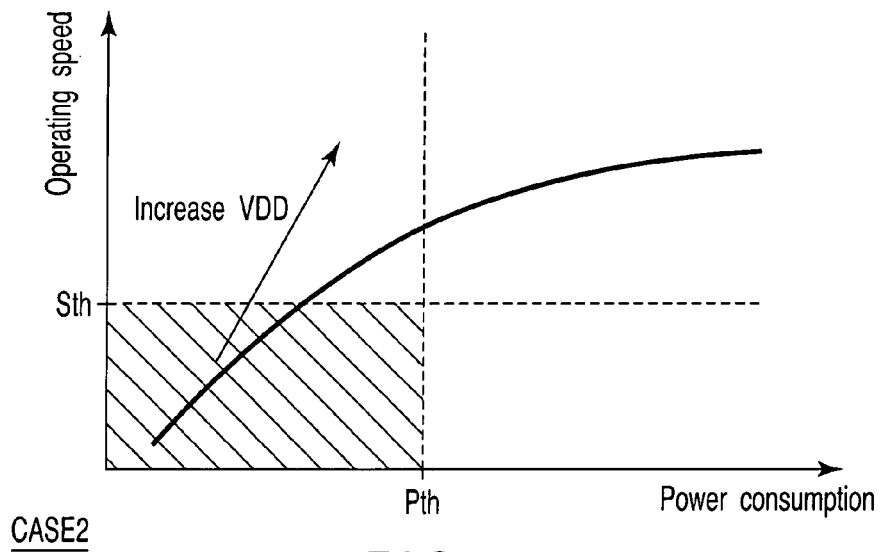
FIG. 9 is a graph showing the relationship between the power consumption and operating speed of an LSI in accordance with the first embodiment of the present invention and also showing that the operating speed is improved by increasing VDD.

The opposite is true. FIG. 9 is a graph showing the relationship between the power consumption during standby and the operating speed in a case (CASE 2) in which the conditions are met for the power consumption but not for the operating speed. As shown in the figure, the performance of the LSI 2 is assumed to correspond to the shaded area in the figure. That is, the power consumption has at most the given value Pth, but the value of the operating speed is smaller than the given value Sth. This corresponds to a case in which, for example, the gate length Lg is large and the threshold voltage Vth is high. In this case, 11 is written to the voltage control circuit 4 as control information CNT. Then, the voltage generating circuit 3 sets a higher power supply voltage VDD in accordance with the table shown in FIG. 2. The increased power supply voltage VDD improves the operating speed of the LSI 2. This makes it possible to set the operating speed equal to or greater than the given value Sth while maintaining the power consumption at the given value Pth as shown by an arrow in FIG. 9.

However, voltage VDD is controlled in accordance with the performance of the whole LSI 2. That is, varying voltage VDD contributes to improving the performance of the LSI 2 as a whole but is not necessarily suitable for the individual circuits in the LSI 2. For example, when attention is focused on the memory cell MC in SRAM 6, a reduction in voltage VDD reduces the threshold voltage Vth of the memory cell MC. An excessive decrease in threshold voltage Vth degrades the data holding property of the memory cell MC.

Figure 10:
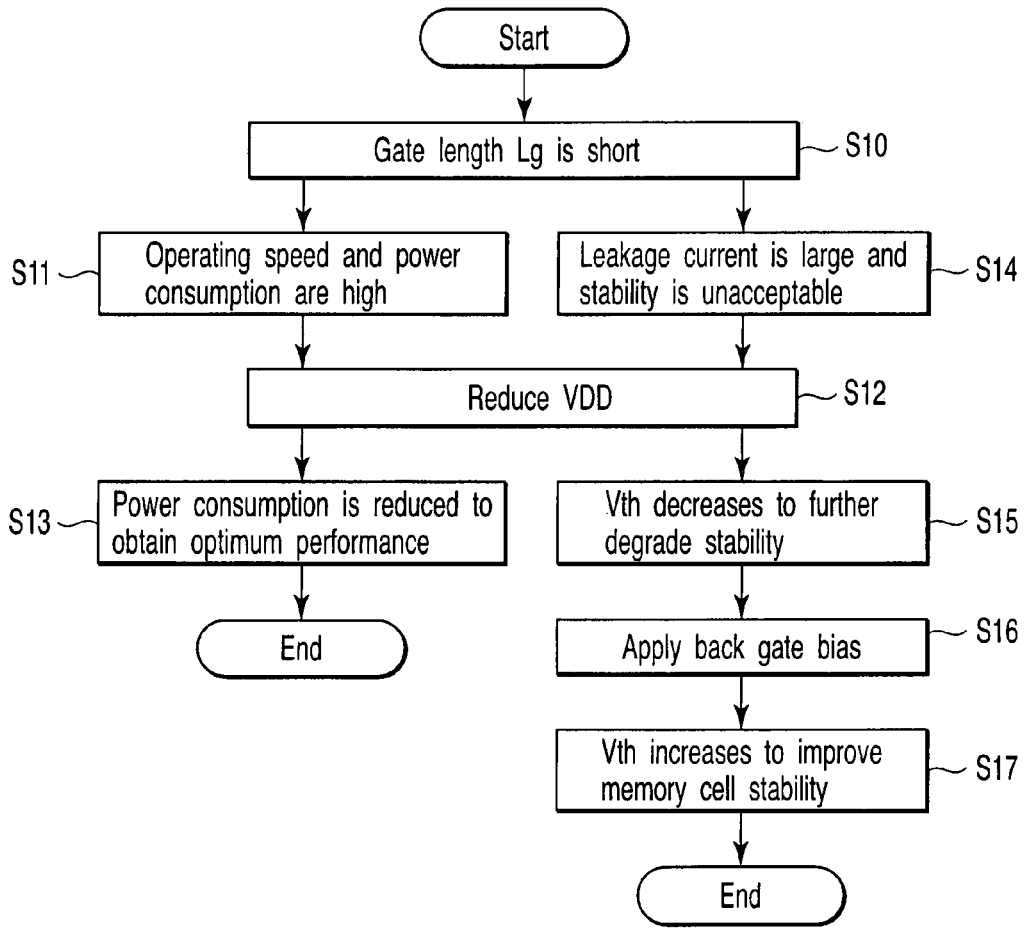
FIG. 10 is a flowchart showing operations of the voltage control circuit and back gate bias generating circuit in an LSI in accordance with the first embodiment of the present invention.

Thus, in the present embodiment, SRAM 6 includes the back gate bias generating circuit 14. In accordance with the control information CNT held by the voltage control circuit 4, the back gate bias generating circuit 14 applies back gate bias voltage Vbb to the memory cell MC to control the threshold voltage Vth of the memory cell MC. More specifically, when VDD decreases (CNT=11→01 or 10), the back gate bias generating circuit 14 generates and applies Vbb=0.2 or 0.1V to the MOS transistors forming the memory cell MC, as a back gate bias. This contributes to increasing the threshold voltage Vth of the memory cell MC. Consequently, the impact of a decrease in VDD can be reduced by Vbb. This effect is shown in the flowchart in FIG. 10.

As shown in the figure, first, the gate length Lg is assumed to be short (step S10). This indicates that the LSI 2 as a whole has a high operating speed and a high power consumption (step S11). Thus, the voltage control circuit 4 reduces power supply voltage VDD generated by the voltage generating circuit 3 (step S12). This reduces the power consumption of the LSI 2 as a whole, allowing the LSI 2 to exhibit the optimum performance (step S13). On the other hand, the reduced gate length Lg (step S10) increases the amount of leakage current from the memory cell MC, degrading the stability of the memory cell MC (step S14). Further, VDD is reduced (step S12) to decrease the threshold voltage Vth of the memory cell MC, further degrading the stability (step S15). The back gate bias generating circuit 14 thus applies back gate bias voltage Vbb to the MOS transistors forming the memory cell MC (Vbb is increased; step S16). This results in the increased threshold voltage Vth of the memory cell MC and the improved stability of the memory cell MC (step S17). That is, the adverse effect of step 15 exerted on the memory cell MC in step S12 is offset by step S16.

Figure 11:
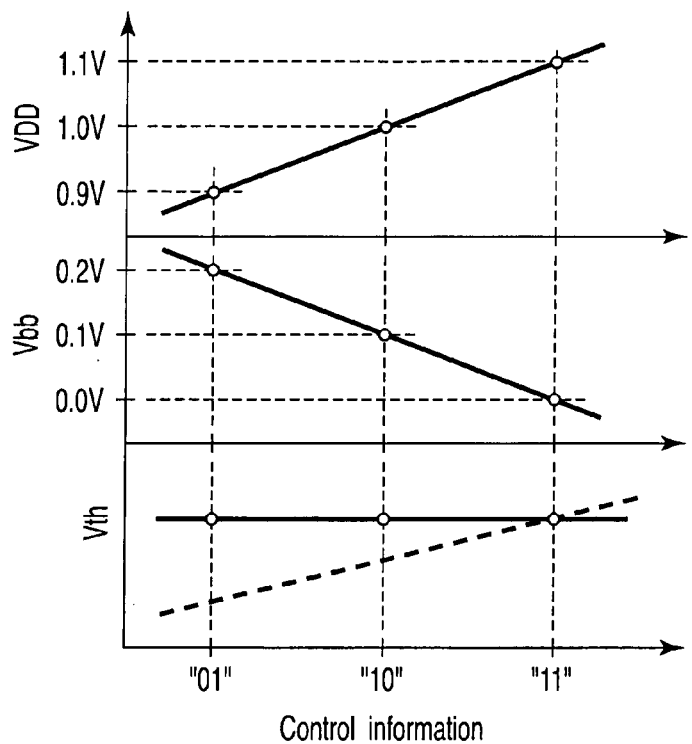
FIG. 11 is a graph showing a variation in power supply voltage, back gate bias voltage, and MOS transistor threshold voltage in response to control information.

This will be described with reference to a graph in FIG. 11 showing the control information and voltages. As shown in the figure, as the control information CNT varies from 11 through 10 to 01, power supply voltage VDD decreases from 1.1V to 1.0 to 0.9V. Correspondingly, back gate bias voltage Vbb increases from zero to 0.1 to 0.2V. This keeps the threshold voltage Vth of the memory cell MC at an almost fixed value. A dashed line for Vth in the figure shows a case in which the back gate bias generating circuit 14 is not used. In this case, Vth decreases consistently with VDD.

In contrast, when VDD increases in accordance with the control information CNT, the back gate bias generating circuit 14 reduces back gate bias voltage Vbb. This reduces the threshold voltage Vth of the memory cell MC, improving the stability of the memory cell MC.

As described above, with the configuration in accordance with the present embodiment, the voltage control circuit 4 controls voltage VDD to reduce, for the LSI 2 as a whole, a variation in properties among LSIs 2 resulting from a manufacturing variation. The back gate bias generating circuit 14 further compensates for the adverse effect of the variation on SRAM 6. This enables the operating stability of the LSI 2 to be improved.

Second Embodiment

Figure 12:
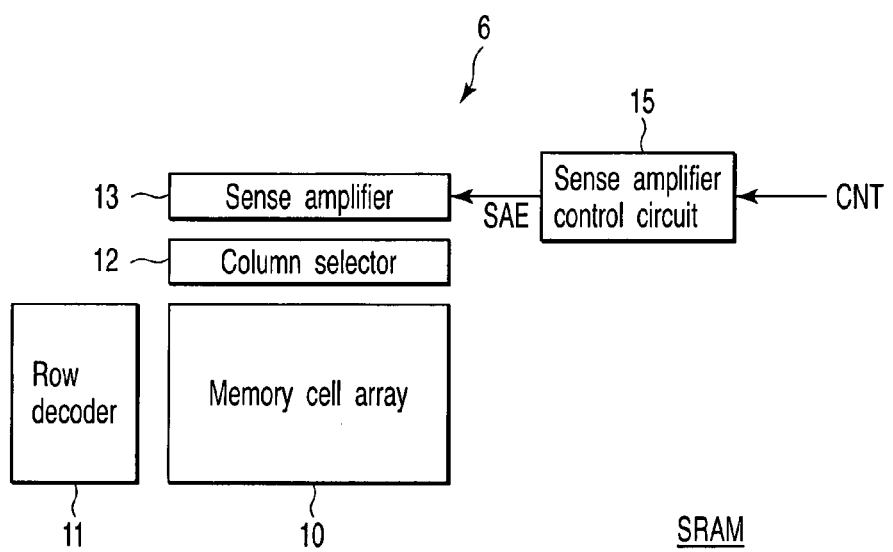
FIG. 12 is a block diagram of SRAM provided in an LSI in accordance with a second embodiment of the present invention.

Now, description will be given of a semiconductor integrated circuit device in accordance with a second embodiment of the present invention. The present embodiment corresponds to the first embodiment in which instead of the memory cell MC, activation timings for the sense amplifier are controlled using the control information CNT. Only differences from the first embodiment will be described below. FIG. 12 is a block diagram of SRAM 6 provided in the LSI 2 in accordance with the present embodiment.

As shown in the figure, SRAM 6 has the configuration in FIG. 3, described in the first embodiment, in which the back gate bias generating circuit 15 is omitted, whereas a sense amplifier control circuit 15 is newly provided. The sense amplifier control circuit 15 generates and supplies a sense amplifier activating signal SAE to the sense amplifier 13. FIG. 13 is a circuit diagram of the sense amplifier control circuit 15.

As shown in the figure, the sense amplifier control circuit 15 includes an internal signal generating circuit 40, a timing control circuit 41, and a timing determining circuit 42. Upon reading data from the memory cell MC, the internal signal generating circuit 40 generates an internal sense amplifier activating signal SAEint for activating the sense amplifier 13. The timing determining circuit 42 determines an output timing for the internal sense amplifier activating signal SAEint to output the determined timing to the sense amplifier 13 as the sense amplifier activation signal SAE. The timing control circuit 41 generates signals SLOW and FAST for determining the output timing for the timing determining circuit 42 to output the determined timing to the timing determining circuit 42. The timing control circuit 41 generates the signals SLOW and FAST on the basis of the control information CNT held by the voltage control circuit 4. FIG. 14 shows the relationship between the control information CNT and the signals SLOW and FAST. FIG. 14 is an example of a table showing the relationship between the control signal CNT and the signals SLOW and FAST. The table is held by the timing control circuit 41. The present embodiment uses two types of control information CNT, 01 and 10. The relationship between the control information CNT and VDD is similar to that in accordance with the first embodiment. As shown in the figure, for the control information CNT=01, the timing control circuit 41 outputs SLOW=1 and FAST=0. For the control information CNT=10, the timing control circuit 41 outputs SLOW=0 and FAST=1.

The timing determining circuit 42 includes NAND gates 43 to 46 and an inverter 47. The NAND gate 43 performs a NAND operation on the signal SAEint and the signal SLOW. The NAND gate 44 performs a NAND operation on the signal SAEint and the signal FAST. The NAND gate 45 performs a NAND operation on an output from the NAND gate 43 and 1 data (VDD). The inverter 47 inverts an output from the NAND gate 45. The NAND gate 46 performs a NAND operation on an output from the NAND gate 44 and an output from the inverter 47. That is, for the control information CNT=01, setting SLOW to 1 and FAST to 0 inverts the output from the inverter 47, making it high, and then makes the output from the NAND gate 46 high. That is, the time when the sense amplifier activating signal SAE is made high is delayed by a delay time in the inverter 47. FIG. 15 is a timing chart of the sense amplifier activating signal SAE. As shown in the figure, for the control information CNT=10, the sense amplifier activating signal SAE is made high at a time t1. In contrast, for the control information CNT=01, the sense amplifier activating signal SAE is made high at a time t2 that is later than the time t1 by the delay time in the inverter 47.

The LSI 2 configured as described above produces the following effect:

(2) A variation in properties among semiconductor elements can be reduced to improve the operating stability of the LSI (item 2).

As is the case with the first embodiment, the LSI 2 in accordance with the present embodiment includes the voltage control circuit 4, which holds the control information CNT. The LSI 2 further includes the sense amplifier control circuit 15, which controls the sense amplifier activating signal SAE in accordance with the control information CNT. This enables the operating stability of the LSI 2 to be improved. This effect will be described below in detail.

As described in the first embodiment, varying voltage VDD contributes to improving the performance of the LSI 2 as a whole but is not necessarily suitable for the individual circuits in the LSI 2. For example, when attention is focused on a read performed on SRAM 6, a variation in voltage VDD may vary a data reading speed and even cause misreading. That is, a decrease in voltage VDD reduces the data reading speed, that is, a speed at which the potential of the bit line BL varies. In this case, too early an activating timing for the sense amplifier 13 causes the sense amplifier 13 to erroneously determine that the bit line BL is high. The sense amplifier 13 thus erroneously determines read data.

Figure 16:
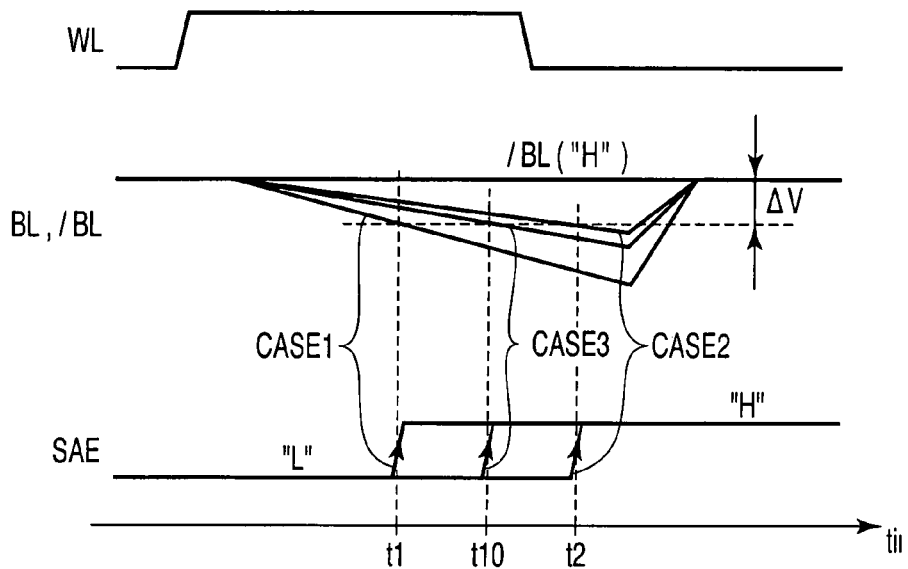
FIG. 16 is a timing chart of a word line, a bit line pair, and a sense amplifier activation signal in SRAM in accordance with the second embodiment of the present invention.

Thus, in the present embodiment, SRAM 6 includes the sense amplifier control circuit 15. In a case in which VDD is low (CNT=01), the sense amplifier control circuit 15 delays the activating timing for the sense amplifier 13 compared to a case in which VDD is high (CNT=10). This will be described with reference to FIG. 16. FIG. 16 is a timing chart of the potentials of the word line WL and the bit line pair BL and /BL as well as the sense amplifier activating signal SAE.

As shown in the figure, to read data, the bit line pair BL and /BL is allowed to float at a certain precharge potential. In this state, a voltage is provided to the word line WL selected by the row decoder 11. Data is read from the selected memory cell MC onto the bit line BL. This allows the bit line BL to be discharged to reduce the potential of the bit line BL. The sense amplifier 13 is activated by the sense amplifier activating signal SAE to determine data on the basis of the potential difference between the bit lines BL and /BL for amplification. A threshold for the potential difference used for the determination is assumed to be $\Delta V$. Here, for a high power supply voltage VDD (CASE 1), the potential of the bit line BL decreases quickly; at the time t1, the potential decrease reaches $\Delta V$ with respect to /BL. For a low voltage VDD (CASE 2), the potential of the bit line varies slowly and the potential decrease reaches $\Delta V$ at the time t2, which is later than the time t1. Thus, in CASE 1, that is, for the control information CNT=10, the sense amplifier activating timing is set to be provided earlier at the time t1. This enables the data reading speed to be improved. In CASE 2, that is, for CNT=01, the sense amplifier activating timing is set to be provided later at the time t2. This makes it possible to prevent data misreading.

Figure 17:
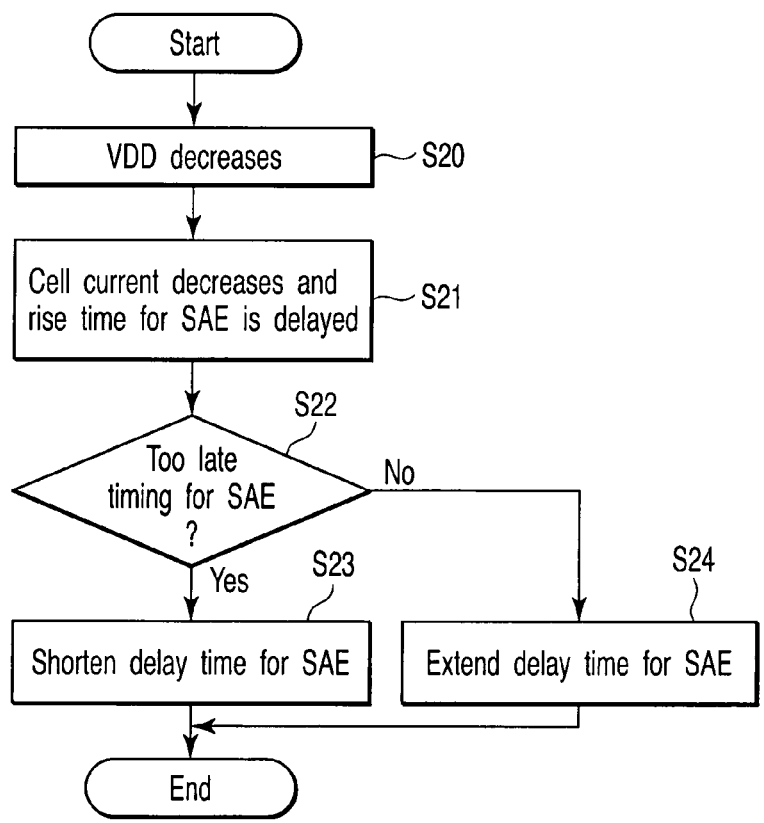
FIG. 17 is a flowchart showing operations of the voltage control circuit and sense amplifier control circuit in SRAM in accordance with the second embodiment of the present invention.

However, the decrease in power supply voltage VDD increases the time for which the bit line BL is discharged, and rise times for the sense amplifier activating signal SAE are also delayed simply by reducing power supply voltage VDD. Consequently, the timing control circuit 41 and the timing determining circuit 42 may not need to be used to delay the timings, or conversely, the decrease in VDD may excessively delays the rise time for the sense amplifier activating signal SAE. In this case, the rise time may be set to be provided earlier in association with a decrease in VDD. This is also shown in the flowchart in FIG. 17.

As shown in the figure, a decrease in power supply voltage VDD (step S20) reduces the cell current through the memory cell MC and simultaneously delays the rise time for the sense amplifier activating signal SAE (step S21). If the rise time is too late (step S22, YES), the sense amplifier control circuit 15 reduces the delay time for the internal sense amplifier activating signal SAEint (SLOW=0, FAST=1) and sets the ringing timing to be provided earlier (step S23). If the rise time is too early (step S22, NO), the sense amplifier control circuit 15 increases the delay time for the internal sense amplifier activating signal SAEint (SLOW=1, FAST=0) and sets the ringing timing to be provided later (step S24).

As described above, with the configuration in accordance with the present embodiment, the voltage control circuit 4 controls voltage VDD to reduce, for the LSI 2 as a whole, a variation in properties among LSIs 2 resulting from a manufacturing variation. The sense amplifier control circuit 15 further compensates for the adverse effect of the variation on SRAM 6. This enables the operating stability of the LSI 2 to be improved.

The description of the above embodiment involves only two cases, CASE 1 and CASE 2, of the rise time for the sense amplifier activating signal. However, at least three cases may be used. For example, as shown in CASE 3 in FIG. 16, a rise time may be provided at a time t10 between the time t1 and the time t2.

Third Embodiment

Figure 18:
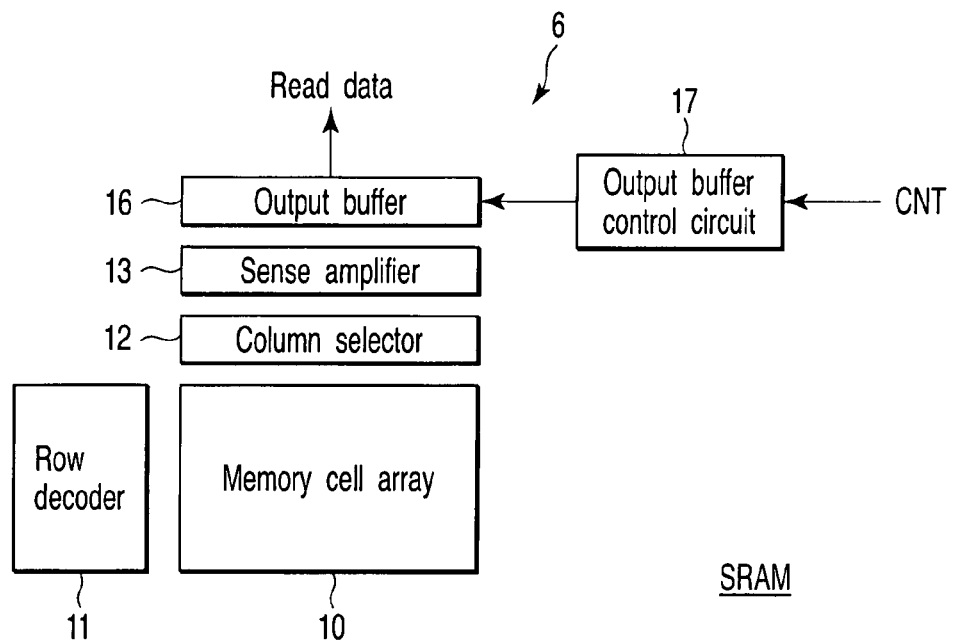
FIG. 18 is a block diagram of SRAM provided in an LSI in accordance with the second embodiment of the present invention.

Now, description will be given of a semiconductor integrated circuit device in accordance with a third embodiment of the present invention. The present embodiment corresponds to the first embodiment in which instead of the memory cell MC, the driving force of an output buffer is controlled on the basis of the control information CNT. Only differences from the first embodiment will be described below. FIG. 18 is a block diagram of SRAM 6 provided in the LSI 2 in accordance with the present embodiment.

Figure 19:
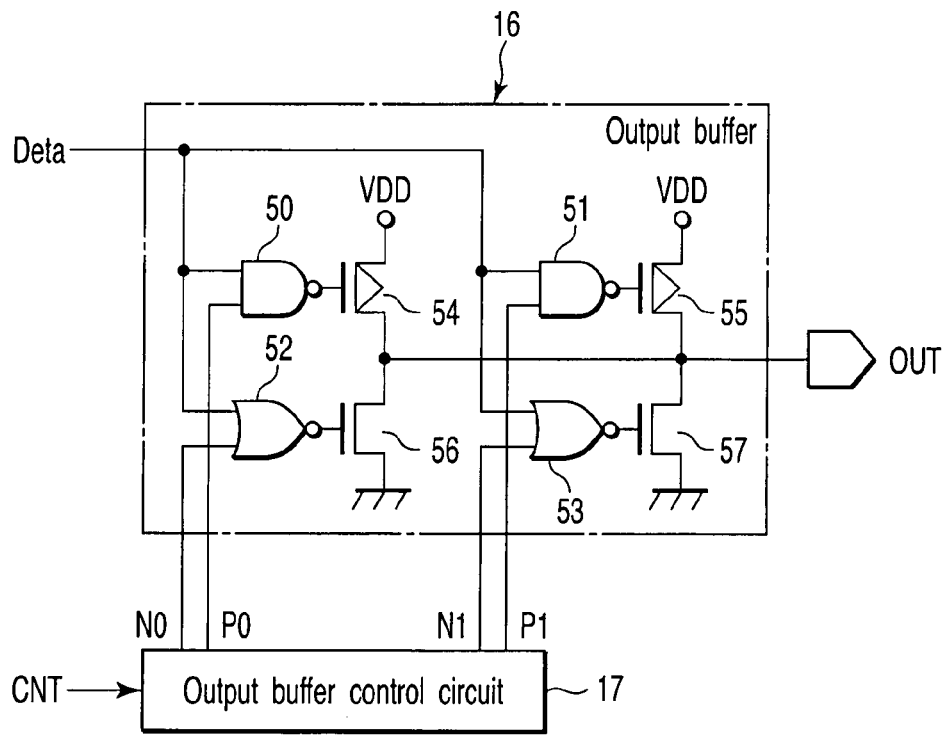
FIG. 19 is a circuit diagram of an output buffer and an output buffer control circuit provided in SRAM in accordance with a third embodiment of the present invention.

As shown in the figure, SRAM 6 has the configuration in FIG. 3, described in the first embodiment, which further includes an output buffer 16 and in which the back gate bias generating circuit 14 is omitted, whereas an output buffer control circuit 17 is newly provided. The output buffer 16 outputs data amplified by the sense amplifier to the exterior of SRAM 6. The output buffer control circuit 17 controls the driving force of the output buffer 16 on the basis of the control information CNT. FIG. 19 is a circuit diagram of the output buffer 16 and the output buffer control circuit 17.

As shown in the figure, the output buffer control circuit 17 generates and outputs signals N0, P0, N1, and P0 to the output buffer 16 on the basis of the control information CNT. FIG. 20 shows the relationship between the control information CNT and the signals N0, P, N1, and P1. FIG. 20 is an example of a table showing the relationship between the control information CNT and the signals P0, N0, P1, and N1. The table is held by the output buffer control circuit 17. The present embodiment uses two types of control information CNT 01 and 10. The relationship between the control information CNT and VDD is similar to that in the first embodiment. As shown in the figure, for the control information CNT=01, the output buffer control circuit 17 outputs P0=1, N0=0, P1=1, and N1=0. For the control information CNT=10, the output buffer control circuit 17 outputs P0=0, N0=1, P1=1, and N1=0.

Now, the configuration of the output buffer 16 will be described with reference to FIG. 19. As shown in the figure, the output buffer 16 includes a NAND gates 50 and 51, NOR gates 52 and 53, p-channel MOS transistors 54 and 55, and n-channel MOS transistors 56 and 57. The NAND gate 50 performs a NAND operation on read data output by the sense amplifier 13 and the signal P0. The NAND gate 51 performs a NAND operation on the read data and the signal P1. The NOR gate 52 performs a NOR operation on the read data and the signal N0. The NOR gate 53 performs a NOR operation on the read data and the signal N1. The MOS transistor 54 has a source connected to VDD, a drain connected to a drain of the MOS transistor 56, and a gate to which an operation result from the NAND gate 50 is input. The MOS transistor 56 has a source that is grounded, and a gate to which an operation result from the NOR gate 52 is input. The MOS transistor 55 has a source connected to VDD, a drain connected to a drain of the MOS transistor 57, and a gate to which an operation result from the NAND gate 51 is input. The MOS transistor 57 has a source that is grounded, and a gate to which an operation result from the NOR gate 53 is input. The connection node between the drain of the MOS transistor 54 and the drain of the MOS transistor 56 is connected to the connection node between the drain of the MOS transistor 55 and the drain of the MOS transistor 57, to form an output node of the output buffer 16.

Now, description will be given of the operations of the output buffer 16 and the output buffer control circuit 17. First, the control information CNT=01, that is, power supply voltage VDD is set low at 0.9V. In this case, on the basis of the control information CNT, the output buffer control circuit 17 makes the following settings: the signal P0=1, the signal N0=0, the signal P1=1, and the signal N1=0. Then, in the output buffer 16, the NAND gates 50 and 51 output 0 for the read data 1 and 1 for the read data 0. The NOR gates 52 and 53 output 0 for the read data 1 and 1 for the read data 0. That is, the read data 1 turns on the MOS transistors 54 and 55 to output 1 to the output node. In contrast, the read data 0 turns on the MOS transistors 56 and 57 to output 0 to the output node. Therefore, for CNT=01, the current driving force of the output buffer 16 is determined by the MOS transistors 54 to 57.

Then, the control information CNT=10, that is, power supply voltage VDD is set high at 1.0V. In this case, on the basis of the control information CNT, the output buffer control circuit 17 makes the following settings: the signal P0=0, the signal N0=1, the signal P1=1, and the signal N1=0. Then, in the output buffer 16, the NAND gate 51 outputs 0 for the read data 1 and 1 for the read data 0. The NOR gate 53 outputs 0 for the read data 1 and 1 for the read data 0. In contrast, the NAND gate 50 and the NOR gate 52 output 1 and 0, respectively, regardless of the read data. That is, the read data 1 turns on the MOS transistor 55 to output 1 to the output node. As opposed to this, the read data 0 turns on the MOS transistor 57 to output 0 to the output node. Therefore, for CNT=10, the current driving force of the output buffer 16 is determined by the MOS transistors 55 and 57, with the MOS transistors 54 and 56 inoperative.

LSI 2 configured as described above produces the following effect:

(3) A variation in properties among semiconductor elements can be reduced to improve the operating stability of the LSI (item 3).

As is the case with the first embodiment, the LSI 2 in accordance with the present embodiment includes the voltage control circuit 4, which holds the control information CNT. The LSI 2 further includes the output buffer control circuit 17, which controls the driving force of the output buffer 16, that is, the current driving force, in accordance with the control information CNT. This enables the operating stability of the LSI 2 to be improved. The current driving force of the output buffer 16 means the ability of the output buffer 16 to supply current to an output node OUT of the output buffer 16. That is, the magnitude of current flowing through the output node OUT increases consistently with the number of those of the MOS transistors 54 to 57 in the output buffer 16 which are turned on. Furthermore, impedance Z1 of the output buffer 16 decreases with increasing current driving force. This effect will be described below in detail.

As described in the first embodiment, varying voltage VDD contributes to improving the performance of the LSI 2 as a whole but is not necessarily suitable for the individual circuits in the LSI 2. This will be described with reference to FIG. 21. FIG. 21 is a circuit diagram showing the output buffer 16 and a load connected to the output buffer 16. As shown in the figure, the impedance of the output buffer 16 is defined as Z1, and the impedance of the load (transmission path) 58 connected to the output buffer 16 is defined as Z2. In this case, a large difference between impedances Z1 and Z2 prevents data output by the output buffer 16 from being efficiently transmitted owing to reflection. Consequently, impedance Z1 of the output buffer 16 is normally optimized in accordance with impedance Z2 of the load 58. However, impedance Z1 of the output buffer 16 depends on power supply voltage VDD. Therefore, if voltage VDD is changed by the voltage control circuit 4, impedance Z1 of the output buffer 16 changes to increase the difference between impedance Z1 and impedance Z2 of the load 58. This may enhance the impact of the reflection. This in turn makes it difficult to efficiently transmit data. Thus, the present embodiment varies the driving force of the output buffer 16 depending on a variation in voltage VDD. This corresponds to a variation in impedance Z1 of the output buffer 16. As a result, the impact of the reflection can be minimized even with a variation in voltage VDD. This effect will be described with reference to a flowchart in FIG. 22.

As shown in the figure, it is assumed that, first, the voltage control circuit 4 increases power supply voltage VDD (step S30, YES). That is, the control information CNT=10. Then, the increase in voltage VDD reduces impedance Z1 of the output buffer 16 (step S31). On the other hand, the output buffer control circuit 17 turns off the MOS transistors 54 and 56 in the output buffer 16 to reduce the driving force of the output buffer 16 (step S32). As a result, the increased impedance Z1 of the output buffer 16 resulting from the increased voltage VDD can be inhibited by the reduced impedance Z1 resulting from the reduced driving force (step S33).

In contrast, it is assumed that the voltage control circuit 4 reduces power supply voltage VDD (step S30, N0). That is, the control information CNT=01. Then, the decrease in voltage VDD increases impedance Z1 of the output buffer 16 (step S34). On the other hand, the output buffer control circuit 17 activates the MOS transistors 54 to 57 in the output buffer 16 to increase the driving force of the output buffer 16 (step S35). As a result, the reduced impedance Z1 of the output buffer 16 resulting from the reduced voltage VDD can be inhibited by the increased impedance Z1 resulting from the increased driving force (step S36).

As described above, with the configuration in accordance with the present embodiment, the voltage control circuit 4 controls voltage VDD to reduce, for the LSI 2 as a whole, a variation in properties among LSIs 2 resulting from a manufacturing variation. The output buffer control circuit 16 further compensates for the adverse effect of the variation on the output buffer 16. This enables the operating stability of the LSI 2 to be improved.

Fourth Embodiment

Figure 23:
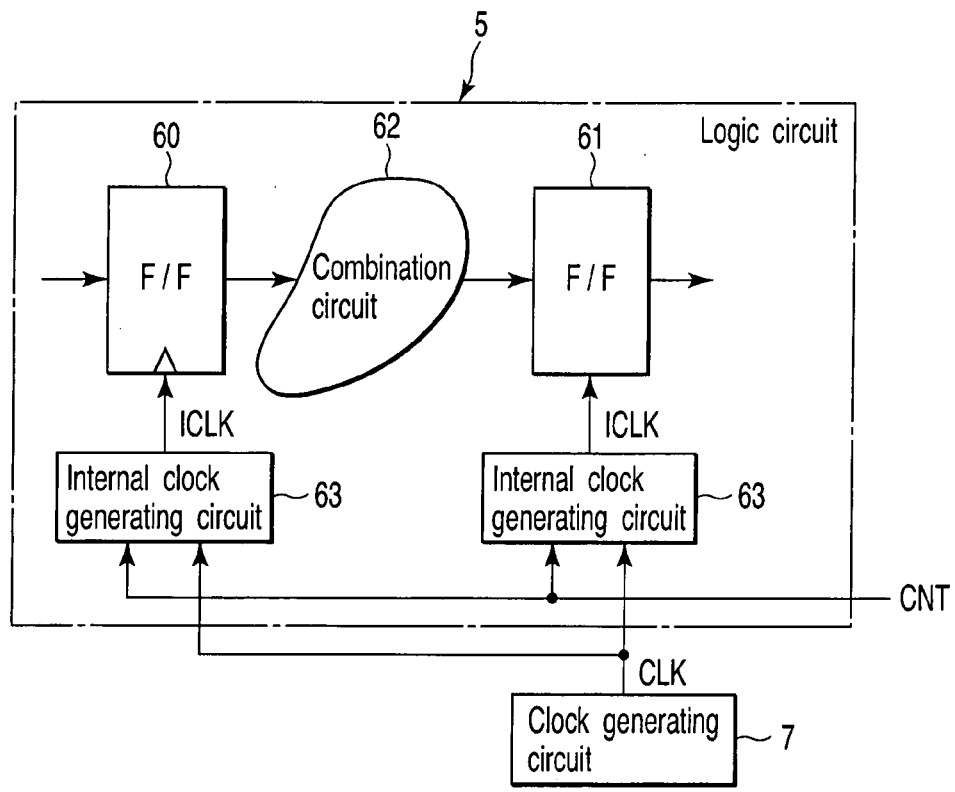
FIG. 23 is a block diagram of a logic circuit provided in an LSI in accordance with a fourth embodiment of the present invention.

Now, description will be given of a semiconductor integrated circuit device in accordance with a fourth embodiment of the present invention. The present embodiment corresponds to the first embodiment in which the operating properties of the logic circuit 5 are varied on the basis of the control information CNT. Only differences from the first embodiment will be described below. FIG. 23 is a block diagram of the logic circuit 5, provided in the LSI 2 in accordance with the present embodiment.

As shown in the figure, the logic circuit 5 includes flip flops 60 and 61, a combination circuit 62, and an internal clock generating circuit 63. The internal clock generating circuit 63 generates an internal clock ICLK on the basis of a clock CLK generated by a clock generating circuit 7, provided in the LSI 2. The flip flops 60 and 61 operate on the basis of an internal clock ICLK generated by the internal clock generating circuit 63. The flip flops 60 and 61 latch and output data in synchronism with the internal clock ICLK. The combination circuit 62 uses data provided by the flip flop 60 to perform an operation and outputs an operation result to the flip flop 61.

Figure 24:
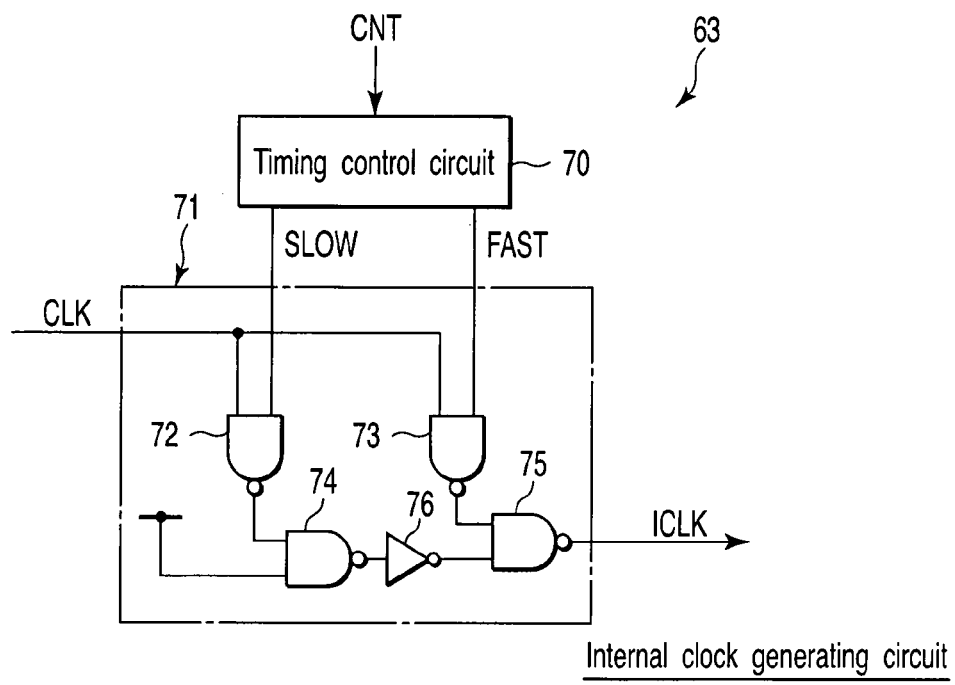
FIG. 24 is a circuit diagram of an internal clock generating circuit provided in the logic circuit in accordance with the fourth embodiment of the present invention.

FIG. 24 is a circuit diagram of the internal clock generating circuit 63. As shown in the figure, the internal clock generating circuit 63 includes a timing control circuit 70 and a timing determining circuit 71.

The timing control circuit 70 generates and outputs the signals SLOW and FAST to the timing determining circuit 71. The timing control circuit 70 generates the signals SLOW and FAST on the basis of the control information CNT held by the voltage control circuit 4. The relationship between the control information CNT and the signals SLOW and FAST is the same as that in FIG. 14, described in the second embodiment. That is, the timing control circuit 70 holds the table shown in FIG. 14. The timing control circuit 70 outputs SLOW=1 and FAST=0 for the control information CNT=01 and SLOW=0 and FAST=1 for the control information CNT=10.

The timing determining circuit 71 uses the clock CLK and the signals SLOW and FAST provided by the timing control circuit 70 to generate the internal clock ICLK. The timing determining circuit 71 includes NAND gates 72 to 75 and an inverter 76. The NAND gate 72 performs a NAND operation on the clock CLK and the signal SLOW. The NAND gate 73 performs a NAND operation on the clock CLK and the signal FAST. The NAND gate 74 performs a NAND operation on an output from the NAND gate 72 and 1 data (VDD). The inverter 76 inverts an output from the NAND gate 74. The NAND gate 75 performs a NAND operation on an output from the NAND gate 73 and an output from the inverter 76. That is, the timing determining circuit 71 has a configuration similar to that of the timing determining circuit 42, described in the second embodiment. Consequently, for CNT=10, the clock CLK is output directly as the internal clock ICLK substantially without being delayed. For CNT=01, the clock CLK delayed by the inverter 76 is output as the internal clock ICLK.

LSI 2 configured as described above produces the following effect:

(4) A variation in properties among semiconductor elements can be reduced to improve the operating stability of the LSI (item 4).

As is the case with the first embodiment, the LSI 2 in accordance with the present embodiment includes the voltage control circuit 4, which holds the control information CNT. The LSI 2 further includes the internal clock generating circuit 63, which generates the internal clock ICLK in accordance with the control information CNT. This enables the operating stability of the LSI 2 to be improved. This effect will be described below in detail.

Figure 25:
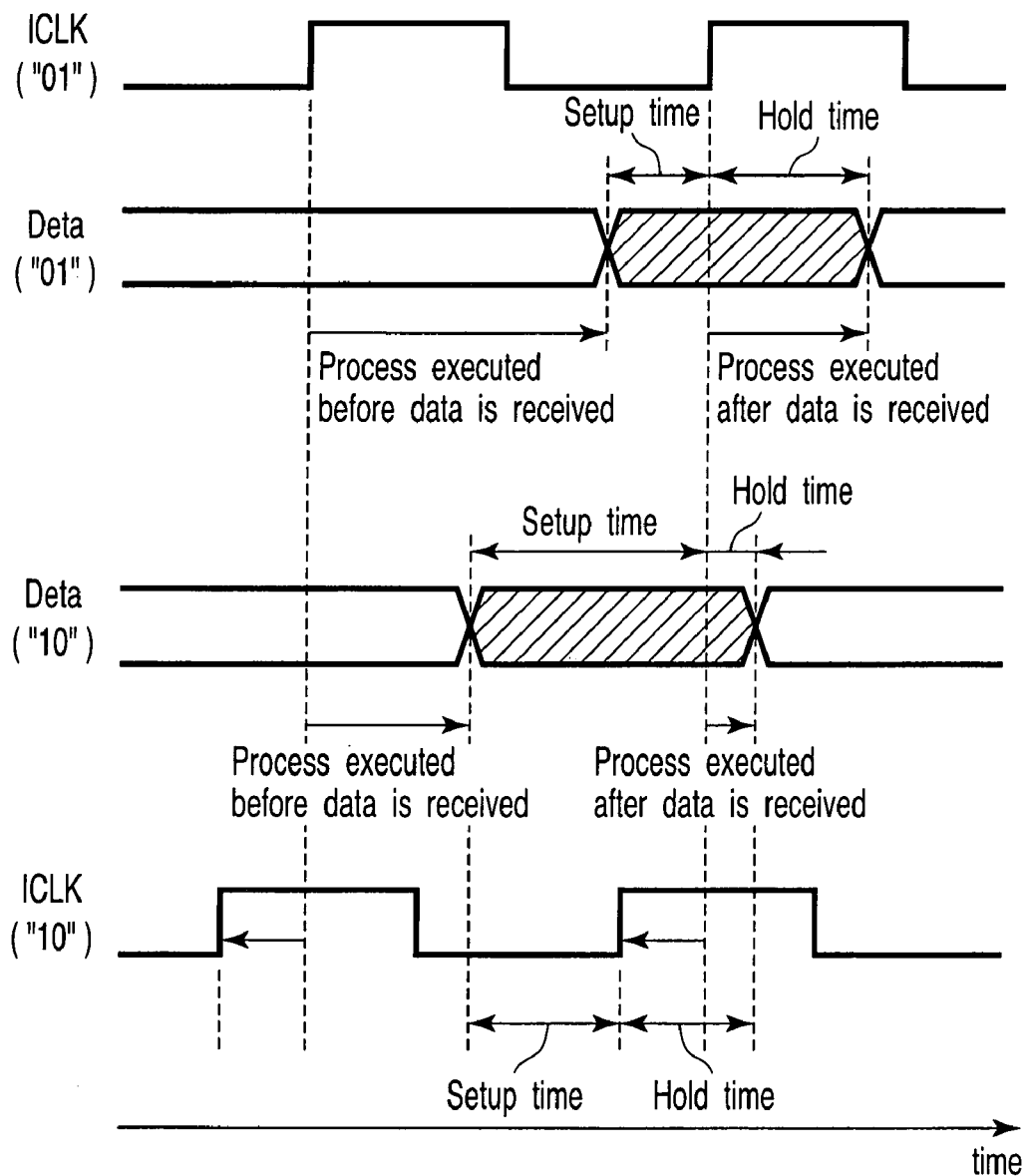
FIG. 25 is a timing chart of an internal clock and data in the logic circuit in accordance with the fourth embodiment of the present invention.

As described in the first embodiment, varying voltage VDD contributes to improving the performance of the LSI 2 as a whole but is not necessarily suitable for the individual circuits in the LSI 2. For example, the operating stability of the logic circuit 5, which latches data in synchronism with the clock, may be degraded. This will be described with reference to FIG. 25. FIG. 25 is a timing chart of the internal clock ICLK and data obtained when the control information CNT is 01 or 10.

First, the case in which the control information CNT=01 will be described. As shown in FIG. 25, when data is loaded into the circuit at the timing of a rising edge of the internal clock ICLK, the data inputting must be started at a time earlier than the timing by a given time. This period is called a setup time. Furthermore, the data must be continuously input for a given time from the timing of the rising edge of the internal clock ICLK. This period is called a hold time. The setup time is determined by the time required for a process of newly receiving data which process is started at the timing of a rising edge that appears one cycle before the internal clock ICLK. The hold time is determined by the time required for a process executed after the data is received at the timing of the rising edge of the clock.

When the control information CNT changes from 01 to 10 to increase power supply voltage VDD, of course the time required for the above process shortens. Then, as is apparent from comparison of the internal clock ICLK for CNT=01 with the data for CNT=10, shown in FIG. 25, the setup time extends, while the hold time shortens. At this time, the excessively shortened hold time reduces the operating margin of the logic circuit 5, making stable operation difficult.

In contrast, in the present embodiment, when the control information CNT changes to 10, the timing control circuit 70 sets the signal FAST to 1. This shifts the phase of the internal clock ICLK compared to that observed when the control information CNT is 01 as shown in FIG. 25. This allows the rise time to be provided earlier. As a result, the data hold time can be extended. That is, the setup time is shortened.

In contrast, when the control information CNT reduces VDD, the hold time is shortened. That is, the setup time is extended.

As described above, with the configuration in accordance with the present embodiment, the voltage control circuit 4 controls voltage VDD to reduce, for the LSI 2 as a whole, a variation in properties among LSIs 2 resulting from a manufacturing variation. The internal clock generating circuit 63 further compensates for the adverse effect of the variation on the logic circuit 5. This enables the operating stability of the LSI 2 to be improved.

Fifth Embodiment

Figures 26, 27:
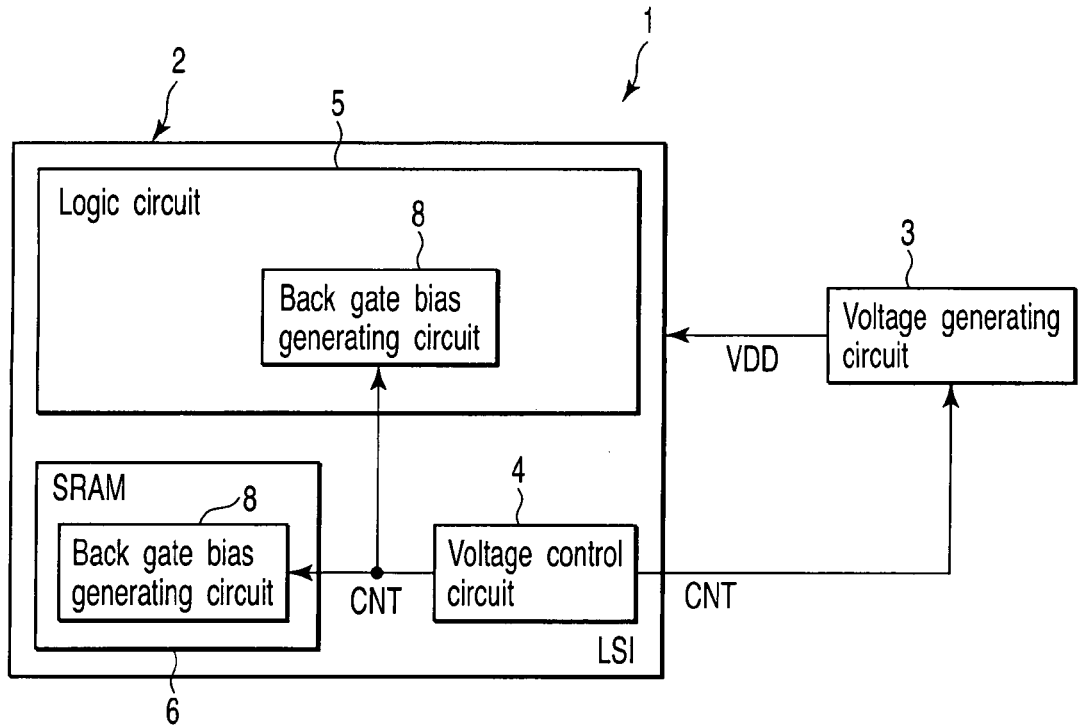
FIG. 26 is a block diagram of an LSI in accordance with a fifth embodiment of the present invention.
FIG. 27 is a table held by a back gate bias generating circuit in accordance with the fifth embodiment of the present invention.

Now, description will be given of a semiconductor integrated circuit device in accordance with a fifth embodiment of the present invention. The present embodiment relates to a technique for optimizing, for each of the circuits contained in the LSI 2, the general properties of the whole circuit on the basis of the control information held by the voltage control circuit 4. FIG. 26 is a block diagram of a semiconductor device system in accordance with the present embodiment.

As shown in FIG. 26, the system 1 includes the semiconductor integrated circuit (LSI) 2 and the voltage generating circuit 3. The voltage generating circuit 3 generates and applies power supply voltage VDD to the LSI 2. The LSI 2 operates using voltage VDD provided by the voltage generating circuit 3.

As is the case with the first embodiment, the LSI 2 includes the voltage control circuit 4, logic circuit 5, and SRAM 6 which are formed on the same semiconductor substrate. The voltage control circuit 4 is similar to that in the first embodiment and controls voltage VDD generated by the voltage generating circuit 3 according to the relationship shown in FIG. 2. At least one of SRAM 6 and the logic circuit 5 has a back gate bias generating circuit 8 inside. The back gate bias generating circuit 8 generates back gate bias voltage Vbb in accordance with the control information CNT held by the voltage control circuit 4. When provided in SRAM 6, the back gate bias generating circuit 8 applies back gate bias voltage Vbb to the back gates of some or all of the MOS transistors in SRAM 6. Alternatively, when provided in the logic circuit 5, the back gate bias generating circuit 8 applies back gate bias voltage Vbb to the back gates of some or all of the MOS transistors in the logic circuit 5.

FIG. 27 is an example of a table showing the relationship between the control information CNT and the magnitude of back gate bias voltage Vbb. The back gate bias generating circuit 8 internally holds the table shown in FIG. 27. As shown in the figure, for CNT=01, the back gate bias generating circuit 14 generates Vbb=0.1V. For CNT=10, the back gate bias generating circuit 14 generates Vbb=0.2V. For CNT=11, the back gate bias generating circuit 14 generates Vbb=0.0V. That is, the back gate bias generating circuit 14 generates back gate bias voltage Vbb so as to vary the threshold voltage Vth of the MOS transistors in accordance with the control information CNT.

LSI 2 configured as described above produces the following effect:

(5) A variation in properties among semiconductor elements can be reduced to improve the operating stability of the LSI (item 5).

Figure 28:
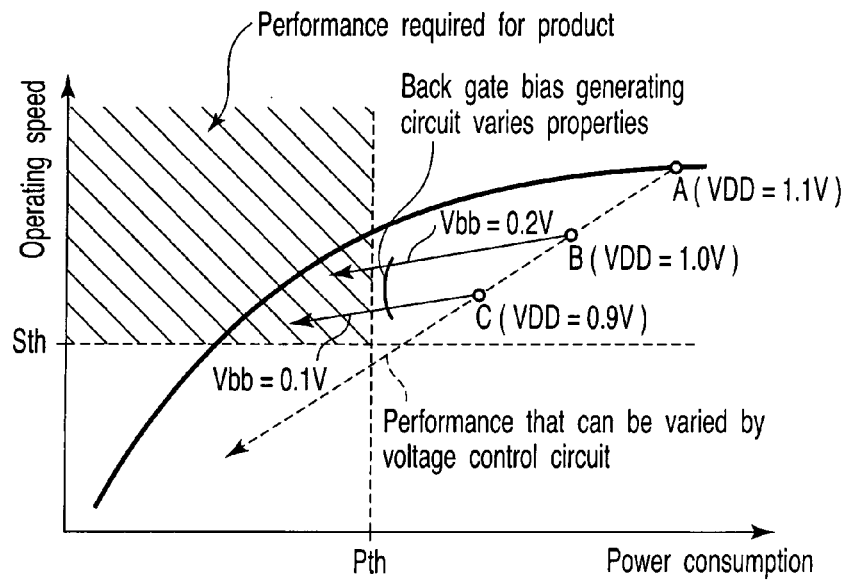
FIG. 28 is a graph showing the relationship between the power consumption and operating speed of an LSI in accordance with the fifth embodiment of the present invention and also showing that the power consumption is reduced by decreasing VDD.

Effects exerted by the present embodiment will be described with reference to FIG. 28. FIG. 28 is a graph showing the relationship between the power consumption and operating speed of the LSI 2. As shown in the figure, for example, it is assumed that the control information CNT of 11 sets the power consumption and operating speed at a power supply voltage VDD of 1.1V to correspond to a point A in the graph. At the point A, the operating speed is at least Sth, whereas the power consumption is higher than Pth. The voltage control circuit 4 thus reduces power supply voltage VDD so that operating points are included in a shaded area in the figure. A dashed arrow in the figure indicates a line obtained by joining operating points together obtained by varying power supply voltage VDD. As shown by the dashed arrow, this LSI 2 cannot meet conditions for the operating speed and power consumption simply by varying power supply voltage VDD.

Thus, in the present embodiment, the back bias gate generating circuit 8 is provided in the logic circuit 5 or/and SRAM 6 to vary the threshold voltage of the MOS transistors in the logic circuit 5 or/and SRAM 6. For example, as shown in FIG. 27, applying back gate bias voltage Vbb increases the threshold voltage of the MOS transistors. The increase in the threshold voltage of the MOS transistors reduces the operating speed and power consumption in view of the whole LSI 2. Thus, as shown in FIG. 28, when for example, the control information CNT is 10 and power supply voltage VDD is 1.0V, back gate bias voltage Vbb=0.2V is applied to increase the threshold voltage of the MOS transistors. This moves the operating point of the LSI 2 moves from a point B to the shaded area as shown by a solid arrow. This also applies to a case in which, for example, the control information CNT is 01 and power supply voltage VDD is 0.9V. In this case, the power consumption is lower than that at the point B. Thus, a back gate bias voltage of 0.1V, which is lower than that obtained for CNT=10, is applied to increase the threshold voltage of the MOS transistors. This moves the operating point of the LSI 2 from a point C to the shaded area as shown by a solid arrow.

As described above, with the configuration in accordance with the present embodiment, not only power supply voltage VDD is varied but the threshold voltage of the MOS transistors in each of the circuits is also varied by the back gate bias generating circuit 8 to vary the power consumption and the operating speed. This makes it possible to reduce a variation in properties among semiconductor elements, allowing the operating stability of the LSI to be improved.

As described above, the first to fifth embodiments of the present invention determine the power supply voltage on the basis of the performance of the whole LSI 2 such as the power consumption and operating speed of the whole LSI 2. The individual circuits in the LSI 2 reference the control information in the voltage control circuit 4 to vary the operating properties of the individual circuits. This makes it possible to offset the adverse effects on the individual circuits which result from a variation in power supply voltage. Therefore, the operating stability of the LSI 2 can be improved.

In the description of the first to fifth embodiments, the LSI 2 includes the combination of the logic circuit 5 and SRAM 6 by way of example. The internal configuration of the LSI 2 is not particularly limited. Of course, the LSI 2 may be, for example, a unitary semiconductor chip. Furthermore, the target in the LSI 2 the properties of which are controlled in accordance with the control information CNT is not limited to a circuit block including a plurality of semiconductor elements as in the case of the above embodiments. The target may be, for example, a single semiconductor element. The operating properties of the individual circuits varied in accordance with the control information are not limited to those described in the first to fourth embodiments.

Figure 29:
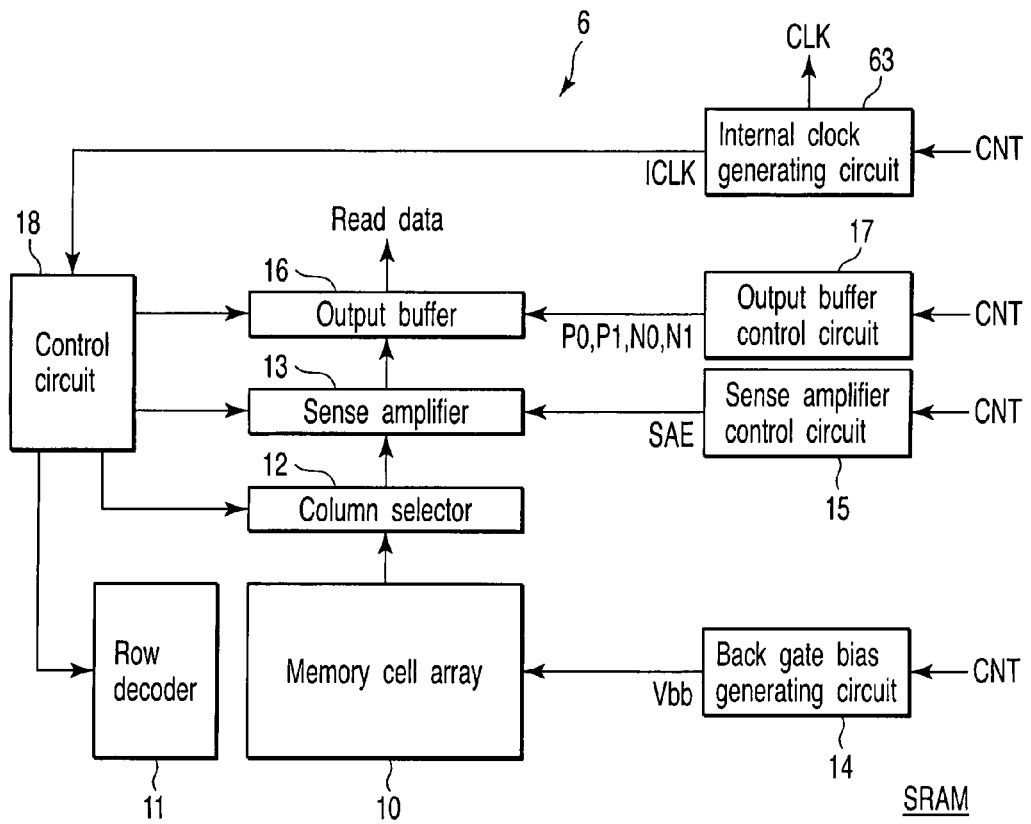
FIG. 29 is a block diagram of SRAM in accordance with a variation of the first to fourth embodiments of the present invention.

Moreover, the first to fourth embodiments may be combined together. FIG. 29 is a circuit block of SRAM 6 obtained by combining the first to fourth embodiments together. As shown in the figure, the present configuration corresponds to the configuration shown in FIG. 3 and described in the first embodiment, the configuration including the sense amplifier control circuit 15, described in the second embodiment, the output buffer 16 and output buffer control circuit 17, described in the third embodiment, the internal clock generating circuit 63, described in the fourth embodiment, and the control circuit 18. The present configuration is a synchronous SRAM that receives and outputs data in synchronism with the internal clock ICLK. The control circuit 18 operates in synchronism with the internal clock ICL to control the circuits. Of course, the fifth embodiment may be applied to the present configuration.

In the description of the above embodiments, by way of example, the voltage generating circuit 3 controls the single LSI 2 in which the logic circuit 5 and SRAM 6 are provided on the same semiconductor substrate. However, as shown in FIG. 30, a plurality of LSIs (semiconductor chips) 2-1 and 2-2 may be provided, and only one of the LSIs (in FIG. 30, LSI 2-1) may include the voltage control circuit 4. In this case, LSI 2-2 uses the control information held by the voltage control circuit 4 in LSI 2-1 to control the operating properties of LSI 2-2. Alternatively, as shown in FIG. 31, the voltage control circuit 4 may be provided outside LSI 2-1. Then, the single voltage control circuit 4 may control the plurality of LSIs.

Furthermore, in the second and fifth embodiments, not only a positive voltage but also a negative voltage may be used as back gate bias voltage Vbb. Moreover, in the description of the fifth embodiment, the threshold voltage is increased as shown in FIG. 28 by way of example. However, if the conditions for the power consumption are met but the conditions for the operating speed are not met, the threshold voltage may be decreased. Moreover, the control information CNT is not limited to the three types of binary numbers each of two digits. At least four types of binary members may be used.

That is, the semiconductor integrated circuit device in accordance with the above embodiments includes the first semiconductor circuit 6 and second semiconductor circuit 5, formed on the semiconductor substrate and operating using voltage VDD provided by the external semiconductor circuit 3 as a power supply voltage; the first control circuit 4, formed on the semiconductor substrate to hold the control information CNT used to control voltage VDD in accordance with the operating performance of the first and second semiconductor circuits 5 and 6 (that is, the LSI 2); and the second control circuits 14, 15, 17, and 63 that control the properties (for example, operating speed and power consumption) of the first semiconductor circuit 6 in accordance with the control information CNT held by the first control circuit 4.

The semiconductor device (semiconductor device system 1) in accordance with the above embodiments includes the semiconductor integrated circuit device 2 having the first semiconductor circuit 6 and second semiconductor circuit 5, formed on the same semiconductor substrate, and operating using voltage VDD provided by the external semiconductor circuit 3 as a power supply voltage; and the first control circuit 4, holding the control information CNT used to control voltage VDD in accordance with the operating performance of the semiconductor integrated circuit device 2, the semiconductor integrated circuit device further including the second control circuits 14, 15, 17, and 63 that control the properties of the first semiconductor circuit 6 in accordance with the control information CNT held by the first control circuit 4.

In the configuration in accordance with the above embodiments, the second control circuits 14, 15, 17, 63 are provided inside the first semiconductor circuit 6.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
    a first semiconductor circuit formed on a semiconductor substrate and operating using a voltage provided by an external power supply circuit as a power supply voltage;
    a second semiconductor circuit formed on the semiconductor substrate and operating using the voltage provided by the external power supply circuit as a power supply voltage;
    a first control circuit formed on the semiconductor substrate and holding control information used to control the external power supply circuit in accordance with operating performance of the first and second semiconductor circuits, a value of the voltage generated by the external power supply circuit depending on the control information; and
    a second control circuit which controls a property of the first semiconductor circuit, the control information being used to control the property of the first semiconductor circuit by the second control circuit in addition to the control of the external power supply circuit by the first control circuit.

2. The device according to claim 1, wherein the second control circuit is provided inside the first semiconductor circuit.

3. The device according to claim 1, wherein the first semiconductor circuit is a semiconductor memory device including a memory cell having a MOS transistor, and
    the second control circuit applies a back gate bias to the MOS transistor in the memory cell.

4. The device according to claim 3, wherein a value of the voltage provided by the external power supply circuit is varied in accordance with the control information,
    when the voltage is reduced in accordance with the control information, the second control circuit increases the back gate bias to increase a threshold voltage of the MOS transistor, and
    when the voltage is increased in accordance with the control information, the second control circuit reduces the back gate bias to reduce the threshold voltage of the MOS transistor.

5. The device according to claim 1, wherein the first semiconductor circuit is a semiconductor memory device including a memory cell array with a plurality of memory cells and a sense amplifier which amplifies data read from the memory cells, and
    the second control circuit varies a timing at which the sense amplifier is activated, in accordance with the control information.

6. The device according to claim 1, wherein the first semiconductor circuit includes an output buffer circuit, and
    the second control circuit controls a current driving ability of the output buffer circuit in accordance with the control information.

7. The device according to claim 6, wherein a value of the voltage provided by the external power supply circuit is varied in accordance with the control information,
    when the voltage is reduced in accordance with the control information, the second control circuit improves the current driving ability of the output buffer, and
    when the voltage is increased in accordance with the control information, the second control circuit degrades the current driving ability of the output buffer.

8. The device according to claim 1, wherein data is loaded into the first semiconductor circuit in synchronism with a clock, and
    second control circuit controls a hold time for the first semiconductor circuit in accordance with the control information.

9. The device according to claim 8, wherein the value of the voltage provided by the external power supply circuit is varied in accordance with the control information,
    when the voltage is reduced in accordance with the control information, the second control circuit shortens the hold time, and
    when the voltage is increased in accordance with the control information, the second control circuit extends the hold time.

10. The device according to claim 1, further comprising a third control circuit which controls a property of the second semiconductor circuit in accordance with the control information.

11. A semiconductor device comprising:
    a semiconductor integrated circuit device including a first semiconductor circuit and a second semiconductor circuit formed on the same semiconductor substrate, and operating using a voltage provided by an external semiconductor circuit as a power supply voltage; and
    a first control circuit which holds control information used to control the external power supply circuit in accordance with operating performance of the semiconductor integrated circuit device, a value of the voltage generated by the external power supply circuit depending on the control information, the semiconductor integrated circuit device further including a second control circuit which controls a property of the first semiconductor circuit, the control information being used to control the property of the first semiconductor circuit by the second control circuit in addition to the control of the external power supply circuit by the first control circuit.

12. The device according to claim 11, wherein the second control circuit is provided inside the first semiconductor circuit.

13. The device according to claim 11, wherein the first semiconductor circuit is a semiconductor memory device including a memory cell having a MOS transistor, and
the second control circuit applies a back gate bias to the MOS transistor in the memory cell.

14. The device according to claim 13, wherein a value of the voltage provided by the external power supply circuit is varied in accordance with the control information,
when the voltage is reduced in accordance with the control information, the second control circuit increases the back gate bias to increase a threshold voltage of the MOS transistor, and
when the voltage is increased in accordance with the control information, the second control circuit reduces the back gate bias to reduce the threshold voltage of the MOS transistor.

15. The device according to claim 11, wherein the first semiconductor circuit is a semiconductor memory device including a memory cell array with a plurality of memory cells and a sense amplifier which amplifies data read from the memory cells, and
the second control circuit varies a timing at which the sense amplifier is activated, in accordance with the control information.

16. The device according to claim 11, wherein the first semiconductor circuit includes an output buffer circuit, and
the second control circuit controls a current driving ability of the output buffer circuit in accordance with the control information.

17. The device according to claim 16, wherein a value of the voltage provided by the external power supply circuit is varied in accordance with the control information,
when the voltage is reduced in accordance with the control information, the second control circuit improves the current driving ability of the output buffer, and
when the voltage is increased in accordance with the control information, the second control circuit degrades the current driving ability of the output buffer.

18. The device according to claim 11, wherein data is loaded into the first semiconductor circuit in synchronism with a clock, and
the second control circuit controls a hold time for the first semiconductor circuit in accordance with the control information.

19. The device according to claim 18, wherein the value of the voltage provided by the external power supply circuit is varied in accordance with the control information,
when the voltage is reduced in accordance with the control information, the second control circuit shortens the hold time, and
when the voltage is increased in accordance with the control information, the second control circuit extends the hold time.

20. The device according to claim 11, further comprising a third control circuit which controls a property of the second semiconductor circuit in accordance with the control information.

* * * * *